(12) United States Patent
Kamigaichi et al.

(10) Patent No.: US 7,781,822 B2
(45) Date of Patent: Aug. 24, 2010

(54) NONVOLATILE SEMICONDUCTOR MEMORY

(75) Inventors: Takeshi Kamigaichi, Kanagawa (JP);
Kikuko Sugimae, Kanagawa (JP);
Hiroyuki Kutsukake, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 598 days.

(21) Appl. No.: 11/246,168

(22) Filed: Oct. 11, 2005

(65) Prior Publication Data

US 2007/0018226 A1      Jan. 25, 2007

(30) Foreign Application Priority Data

Jul. 21, 2005     (JP) .............................. 2005-211920

(51) Int. Cl.
*H01L 29/788* (2006.01)
(52) U.S. Cl. ...................................... 257/314; 257/316
(58) Field of Classification Search ......... 257/314–326, 257/E29.129, E29.3
See application file for complete search history.

(56) References Cited

U.S. PATENT DOCUMENTS

| 6,420,754 | B2 * | 7/2002 | Takahashi et al. ........... 257/326 |
| 6,720,612 | B2 | 4/2004 | Takeuchi et al. |
| 2005/0139904 | A1 | 6/2005 | Kamigaichi et al. |

FOREIGN PATENT DOCUMENTS

| JP | 11-186528 | 7/1999 |
| JP | 2000-100975 | 4/2000 |
| JP | 2000-269468 | 9/2000 |
| JP | 2002-280463 | 9/2002 |
| JP | 2002-353330 | 12/2002 |
| JP | 2003-347511 | 12/2003 |
| JP | 2004-79893 | 3/2004 |
| JP | 2005-64529 | 3/2005 |
| JP | 2005-136038 | 5/2005 |

OTHER PUBLICATIONS

U.S. Appl. No. 12/117,231, filed May 8, 2008, Nagano.
U.S. Appl. No. 12/125,546, filed May 22, 2008, Matsunaga, et al.

* cited by examiner

*Primary Examiner*—Cuong Q Nguyen
(74) *Attorney, Agent, or Firm*—Oblon, Spivak, McClelland, Maier & Neustadt, L.L.P.

(57) ABSTRACT

A nonvolatile semiconductor memory includes: a memory cell transistor including a gate insulating film, a floating gate electrode, an inter-gate insulating film, and a control gate electrode; a low voltage transistor constituted by a low voltage gate insulating film, a floating gate electrode, an inter-gate insulating film having an opening, a control gate electrode, a first gate contact plug, and a first metallic salicide film electrically in contact with the first gate contact plug; and a high voltage transistor constituted by a high voltage gate insulating film, a floating gate electrode, an inter-gate insulating film having an opening, a control gate electrode, a second gate contact plug, and a second metallic salicide film electrically in contact with the second gate contact plug. The metallic salicide film is formed only directly beneath the gate contact plug.

20 Claims, 35 Drawing Sheets

NONVOLATILE SEMICONDUCTOR MEMORY

CROSS REFERENCE TO RELATED APPLICATIONS AND INCORPORATION BY REFERENCE

This application is based upon and claims the benefit of priority from prior Japanese Patent Application P2005-211920 filed on Jul. 21, 2005; the entire contents of which are incorporated by reference herein.

BACKGROUND OF THE INVENTION

1. Field of the Invention

The present invention relates to a nonvolatile semiconductor memory. More specifically, it relates to a nonvolatile semiconductor memory, which uses a metallic salicide film as an electrode film.

2. Description of the Related Art

An electrically data-erasable programmable read-only memory (EEPROM) is known as a nonvolatile semiconductor memory. The EEPROM, in particular, a NAND EEPROM includes a memory cell array comprised of memory cells disposed on respective intersections of horizontal word lines and vertical bit lines. Typically, a memory cell is structured by, for example, a MOS transistor having a stacked gate structure of a floating gate and a control gate.

A NAND flash memory has a structure where multiple memory cell transistors are connected in series to constitute a NAND string, and select transistors are disposed on both sides of the NAND string. In addition, a memory cell array is arranged with an element isolating region (STI) in parallel with an element activation region of a memory cell.

A nonvolatile semiconductor memory, such as a flash EEPROM, requires a high voltage circuit region for providing high voltage pulses, such as a write-in voltage, an intermediate voltage, and an erase voltage, to a memory cell array region. In addition, there is a typical low voltage circuit region to which low voltage pulses are provided and for which high-speed performance is required.

However, in a low voltage circuit region, use of a high-speed transistor with higher driving capability is advantageous. More specifically, in a low voltage circuit region of a flash EEPROM capable of low power supply voltage operation, transistors are required to have a sufficient driving capability in order to realize a high speed performance. On the other hand, an increase in capacity of a memory cell array requires a decrease in word line resistance in a memory cell region, so as to increase writing/reading speed. Forming a metallic salicide film on a word line in a NAND flash memory is a technique for preventing a word line delay due to increased capacity and increasing the operating speed.

A low voltage circuit region needs to include a higher-speed transistor with higher driving capability. Forming a metallic salicide film in a gate and a diffusion layer decreases word line resistance in a memory cell region of a large capacity memory cell array and increases writing/reading speed.

However, as with CMOS logic, in the case where a metallic salicide film is formed on gates and diffusion layers in an entire circuit region of a nonvolatile semiconductor memory, such as a flash EEPROM, it is important to prevent an increase in junction leakage and degradation in junction breakdown voltage and surface breakdown voltage in a transistor fabricated within a high voltage circuit region. The high voltage circuit region provides high voltage pulses of 15 V or greater, such as programming voltage $V_{pgm}$ and erase voltage $V_{erase}$.

In addition, a decrease in resistance of a resistive element may require an increase in element area and degradation in the gate breakdown voltage of a transistor in the high voltage peripheral circuit. Forming a metallic salicide film on a selected region may solve the aforementioned problems, however, the metallic salicide film may cause increased difficulty in device fabrication, due to the metallic salicide film.

In particular, since the NAND structure requires a higher voltage than that for the AND and the NOR structure, and increases junction leakage and junction breakdown voltage.

According to a nonvolatile semiconductor memory and a fabrication method for the same, disclosed in Japanese Patent Application Laid-Open No. 2000-100975, a trench is formed, extending along the word line length, on a control gate, a metallic interconnect is formed on an interlayer insulating film, and the metallic interconnect is filled in the trench, thereby decreasing the resistance of a polycide word line. This structure decreases word line resistance and reduces memory reading duration without complicating the fabrication process.

According to a semiconductor memory and a fabrication method for the same, in Japanese Patent Application Laid-Open No. 2003-347511, silicide layers are not formed on the top surface of an impurity diffusion layer in a memory cell transistor. Instead, a silicide layer is formed on a gate electrode, and a silicide layer is formed on the gate electrode and the diffusion layer in a logic region, so as to increase the operating speed of the device.

SUMMARY OF THE INVENTION

An aspect of the present invention inheres in a nonvolatile semiconductor memory which includes a cell array region configured to include a memory cell transistor that comprises first source and drain regions, a gate insulating film on a semiconductor region between the first source and drain regions, a first floating gate electrode on the gate insulating film, and a first control gate electrode stacked on the first floating gate electrode via a first inter-gate insulating film. A circuit region is configured to include a transistor that comprises an element isolating region, second source and drain regions, which are isolated by the element isolating region, a gate insulating film on a semiconductor region between the second source and drain regions, a second floating gate electrode on the gate insulating film, a second inter-gate insulating film, having an opening, on the second floating gate electrode, a second control gate electrode on the second inter-gate insulating film, a metallic salicide film on the second control gate electrode, and a gate contact electrically in contact with the metallic salicide film. The metallic salicide film is formed only directly beneath the gate contact.

Another aspect of the present invention inheres in a nonvolatile semiconductor memory which includes a cell array region configured to include first source and drain regions, a gate insulating film on a semiconductor region between the first source and drain regions, a first floating gate electrode on the gate insulating film, and a first control gate electrode stacked on the first floating gate electrode via a first inter-gate insulating film. A low voltage circuit region is configured to include a low voltage transistor that comprises a first element isolating region, second source and drain regions, which are isolated by the first element isolating region, a low voltage gate insulating film on a semiconductor region between the second source and drain regions, a second floating gate electrode on the low voltage gate insulating film, a second inter-gate insulating film, having an opening, on the second floating gate electrode, a second control gate electrode on the second inter-gate insulating film, a first metallic salicide film on the second control gate electrode, and a first gate contact electrically in contact with the first metallic salicide film. A high voltage circuit region is configured to include a high voltage transistor that comprises a second element isolating region, third source and drain regions, which are isolated by the second element isolating region, a high voltage gate insulating film on a semiconductor region between the third source and drain regions, a third floating gate electrode on the high voltage gate insulating film, a third inter-gate insulating film, having an opening, on the third floating gate electrode, a third control gate electrode on the third inter-gate insulating film, a second metallic salicide film on the third control gate electrode, and a second gate contact electrically in contact with the second metallic salicide film; and a resistive element configured to include a third element isolating region configured to isolate, from the cell array region, the low voltage circuit region, and the high voltage circuit region, a fourth control gate electrode on the third element isolating region, a resistive contact in electrical contact with the fourth control gate electrode, and a third metallic salicide film in electrical contact with the resistive contact. The first metallic salicide film is formed only directly beneath the first gate contact; the second metallic salicide film is formed only directly beneath the second gate contact; and the third metallic salicide film is formed only directly beneath the resistive contact.

DETAILED DESCRIPTION OF THE INVENTION

Figure 1:
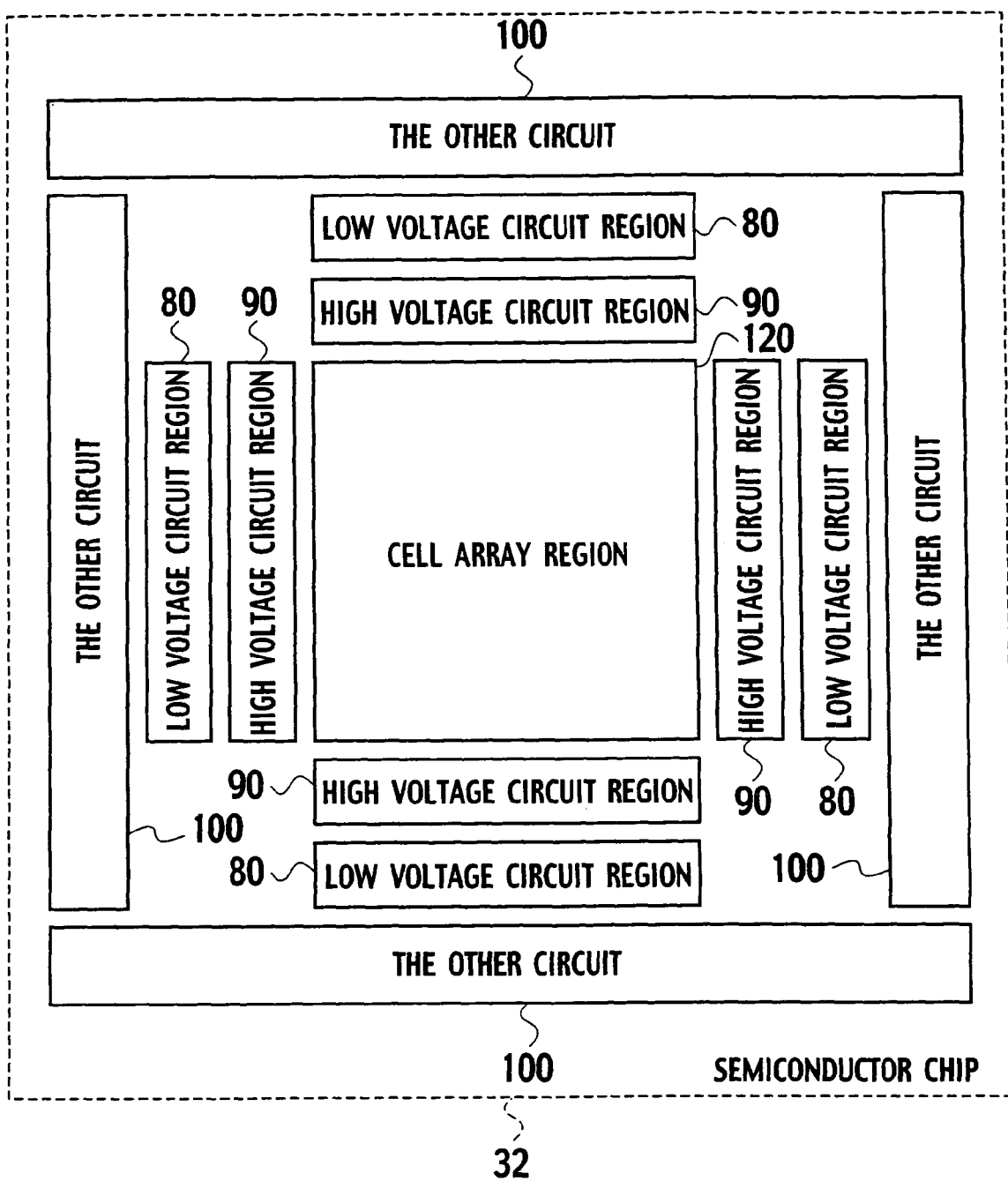
FIG. 1 is a block diagram showing an entire planar pattern of a nonvolatile semiconductor memory according to a first through a fifth embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Referring to the drawings, embodiments of the present invention are described below. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

Next, a first to a fifth embodiment of the present invention are described while referencing drawings. The same or similar reference numerals are attached to the same or similar parts in the following drawing description. Note that those drawings are merely schematics and thus relationship between thickness of respective parts and two-dimensional size thereof and ratio of respective parts in thickness may be inconsistent with reality according to the present invention. It is also noted that the relationship between a waveform and time axis in each timing chart and ratio of waveforms in each timing chart are different from reality, according to the present invention. Moreover, it is natural that there are parts differing in relationship and ratio of dimensions among the drawings.

The first through the fifth embodiment as described below exemplify an apparatus or systems, which embody technical ideas according to the present invention. Therefore, the technical ideas according to the present invention do not limit shapes, structures, arrangements or the like of parts to those described below. The technical ideas according to the present invention may be modified into a variety of modifications within the scope of the claimed invention.

Note that 'directly beneath a gate contact' or 'directly beneath a contact' includes a case where a part of a metallic salicide film 11 is formed on an area, except for directly beneath a contact due to misalignment of the contact. In addition, the floating gate electrodes of a high and a low voltage transistor are conductive layers made of the same material as the floating gate electrode of a memory cell transistor. Similarly, the control gate electrodes of a high and a low voltage transistor are conductive layers made of the same material as the control gate electrode of a memory cell transistor.

The nonvolatile semiconductor memory according to the present invention increases operating speed, improves integration, and permits easy fabrication of a memory cell transistor, increases operating speed and permits easy fabrication of a low voltage transistor, increases breakdown voltage, increases operating speed, and permits easy fabrication of a high voltage transistor, and also increases operating speed and permits easy fabrication of a resistive element and an interconnect region.

First Embodiment (Entire Planar Pattern Block Structure)

As schematically shown in FIG. 1, for example, a block structure of a nonvolatile semiconductor memory according to the first embodiment of the present invention comprises a cell array region 120 disposed on a semiconductor chip 32, high voltage circuit regions 90, low voltage circuit regions 80, and other circuit regions 100 including low voltage circuits, high voltage circuits, and resistive element regions. The high voltage circuit regions 90 include circuits for providing the cell array region 120 with relatively higher voltage pulses than power supply voltages, such as programming voltage $V_{pgm}$ and erase voltage $V_{erase}$. The low voltage circuit regions 80 include logic circuits such as CMOS circuits, which are required to operate at a relatively high speed with low power consumption. The other circuit regions 100 include low voltage circuits and high voltage circuits other than those included in the low voltage circuit regions 80 and the high voltage circuit regions 90, and resistive element regions for providing reference voltages or the like.

According to the nonvolatile semiconductor memory of the first embodiment of the present invention, the cell array region 120, the high voltage circuit regions 90, and the low voltage circuit regions 80 particularly relate to one another as described below. In addition, the cell array region 120 and the low voltage circuits, the high voltage circuits, and the resistive element regions for providing reference voltages within the other circuit regions 100 relate to one another as described below. Moreover, the cell array region 120, the high voltage circuit regions 90, the low voltage circuit regions 80, and the interconnect regions within the other circuit regions 100 relate to one another as described below.

Figure 2:
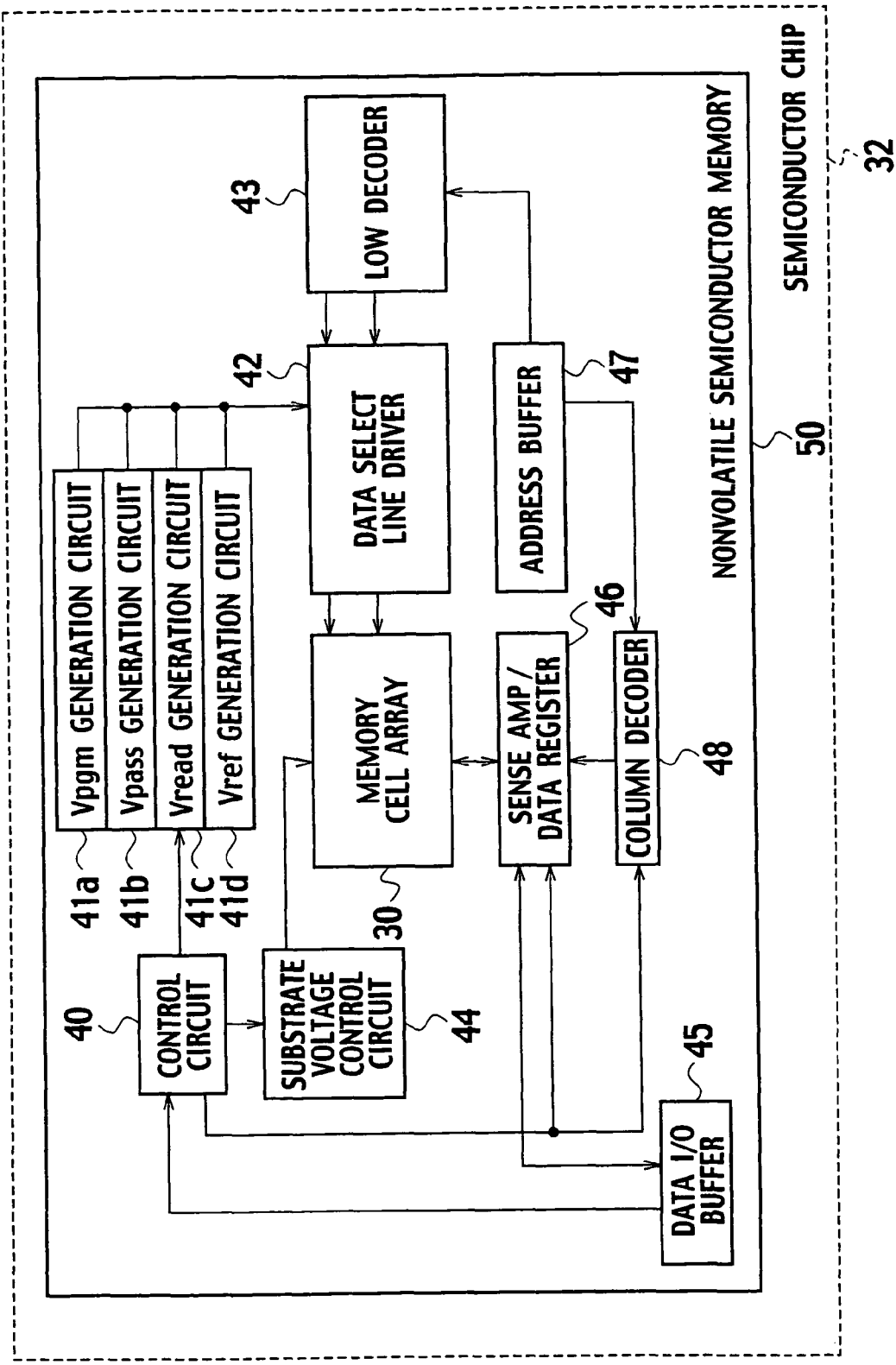
FIG. 2 is a further detailed block diagram of the entire planar pattern of the nonvolatile semiconductor memory according to the first through the fifth embodiment of the present invention.

To describe the structure in further detail, as shown in FIG. 2, the nonvolatile semiconductor memory according to the first embodiment of the present invention comprises a memory cell array 30, a data select line driver 42, a row decoder 43, an address buffer 47, a column decoder 48, a sense amplifier/data register 46, a data input/output (I/O) buffer 45, a substrate voltage control circuit 44, a control circuit 40, a $V_{pgm}$ generation circuit 41a, a $V_{pass}$ generation circuit 41b, a $V_{read}$ generation circuit 41c, and a $V_{ref}$ generation circuit 41d.

The memory cell array 30 comprises memory cell blocks arranged in a matrix in which nonvolatile memory cells and select transistors are connected in series or in parallel, which is described later. The sense amplifier/data register 46 is provided for sensing data on a data transfer line in the memory cell array 30 and retaining write-in data. The sense amplifier/ data register 46 also serves as a data latch, which may be made up of flip-flop circuits as the main element. The sense amplifier/data register 46 is connected to the data I/O buffer 45. The connection is controlled by the output of the column decoder 48, which receives an address signal from the address buffer 47. Data received by the data I/O buffer 45 may be written to the memory cell array 30, and data stored in the memory cell array 30 may be read out to the data I/O buffer 45. The memory cell array 30 includes the row decoder 43, which comprises constituted by an address selecting circuit, for selecting a memory cell element, more specifically, for controlling data select lines and block select lines.

The substrate voltage control circuit 44 is provided for controlling the voltage of a p-type semiconductor substrate 1 (or p-well region) on which the memory cell array 30 is formed. In particular, it is desirable that the substrate voltage control circuit 44 be structured so that the voltage can be boosted up to an erase voltage of 10 V or more when erasing data. In addition, the $V_{pgm}$ generation circuit 41a for generating programming voltage $V_{pgm}$, which is boosted up to a higher voltage than the power supply voltage, when writing data to a selected memory cell transistor within the memory cell array 30. In addition to the $V_{pgm}$ generation circuit 41a, the $V_{pass}$ generation circuit 41b for generating programming intermediate voltage $V_{pass}$ to be provided to non-selected memory cells when writing data, and the $V_{read}$ generation circuit 41c for generating reading intermediate voltage $V_{read}$ to be provided to non-selected memory cells when reading data, are provided. Those circuits are controlled by the control circuit 40 so that appropriate voltage outputs are provided to the data select line driver 42 when writing, erasing, and reading data, respectively.

The programming voltage $V_{pgm}$ is between 6 V and 30 V; and the programming intermediate voltage $V_{pass}$ is between 3 V and 15 V. The reading intermediate voltage $V_{read}$ is between 1 V and 9 V. In the case of a NAND memory cell array, the reading intermediate voltage $V_{read}$ is desirable to be approximately 1 V higher than the upper limit of the threshold write-in voltage so as to ensure sufficient reading current and decrease read disturb. The data select line driver 42 is a switch circuit configured to provide a voltage output to a control gate electrode, in a memory cell transistor, to be written or read and a gate electrode, in a select transistor, in conformity with the output of the row decoder 43.

The high voltage circuit regions 90 correspond to the data select line driver 42 and the row decoder 43 in FIG. 2; and the low voltage circuit regions 80 correspond to the sense amplifier/data register 46 and the column decoder 48 in FIG. 2. In addition, the high voltage transistor is used in the high voltage circuit regions 90 and receives a voltage of 15 V or more. The low voltage transistor is used in the low voltage circuit regions 80 and receives a voltage of less than 15 V.

(Element Structure)

As shown in FIGS. 1, and 15 through 29, the nonvolatile semiconductor memory according to the first embodiment of the present invention comprises: a cell array region 120, which includes memory cell transistors having source and drain regions 20, gate insulting films 2 on a semiconductor region between the source and drain regions 20, floating gate electrodes 4 on the gate insulating films 2, and control gate electrodes 7 stacked on the floating gate electrodes 4 via inter-gate insulating films 12; low voltage circuit regions, which include low voltage transistors having element isolating regions 3, source and drain regions 21 isolated by the element isolating regions 3, a low voltage gate insulating film 6 on the semiconductor region between the source and drain regions 21, a floating gate electrode 4 on the low voltage gate insulating film 6, an inter-gate insulating film 12 having an opening on the floating gate electrode 4, a control gate electrode 7 on the inter-gate insulating film 12, a metallic salicide film 11 on the control gate electrode 7, and a gate contact (CG) plug 26 which is electrically in contact with the metallic salicide film 11; and high voltage circuit regions, which include high voltage transistors having element isolating regions 3, source and drain regions 22 isolated by the element isolating regions 3, a high voltage gate insulating film 5 on the semiconductor region between the source and drain regions 22, a floating gate electrode 4 on the high voltage gate insulating film 5, an inter-gate insulating film 12 having an opening on the floating gate electrode 4, a control gate electrode 7 on the inter-gate insulating film 12, a metallic salicide film 11 on the control gate electrode 7, and a gate contact (CG) plug 26 which is electrically in contact with the metallic salicide film 11. The metallic salicide film 11 is formed only directly beneath the gate contact (CG) plug 26.

Figure 27:
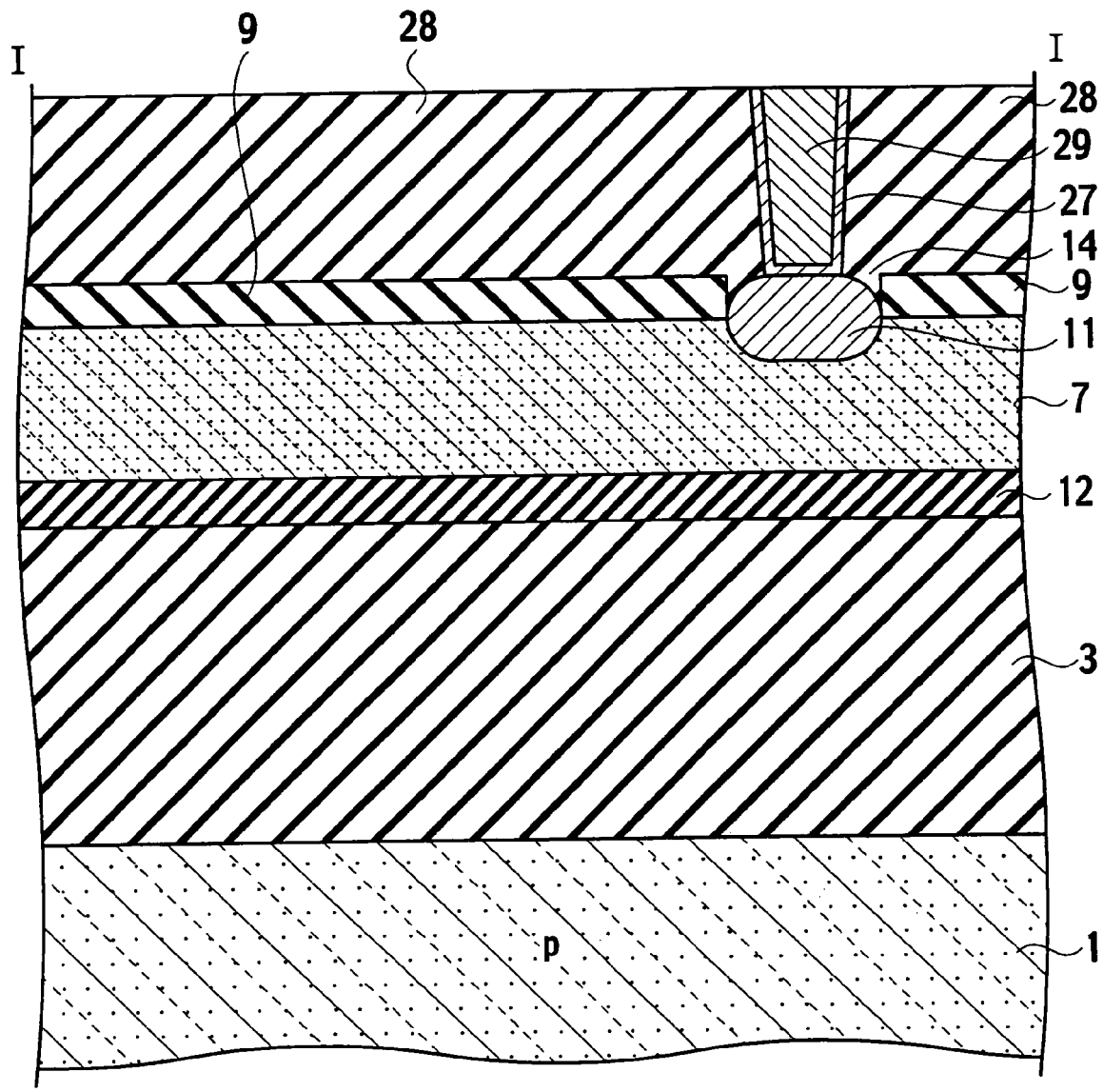
FIG. 27 schematically shows a cross-section cut along the line I-I of FIG. 26.

Alternatively, as shown in FIG. 27, the nonvolatile semiconductor memory according to the first embodiment of the present invention may further include a resistive element comprising the element isolating region 3, which isolates the cell array region 120, the low voltage circuit regions 80, and the high voltage circuit regions 90, the control gate electrode 7 on the element isolating region 3, a resistive contact (CR) plug 29, which is electrically in contact with the control gate electrode 7, and the metallic salicide film 11, which is electrically in contact with the resistive contact (CR) plug 29. The metallic salicide film 11 may be formed only directly beneath the resistive contact (CR) plug 29.

Figure 15:
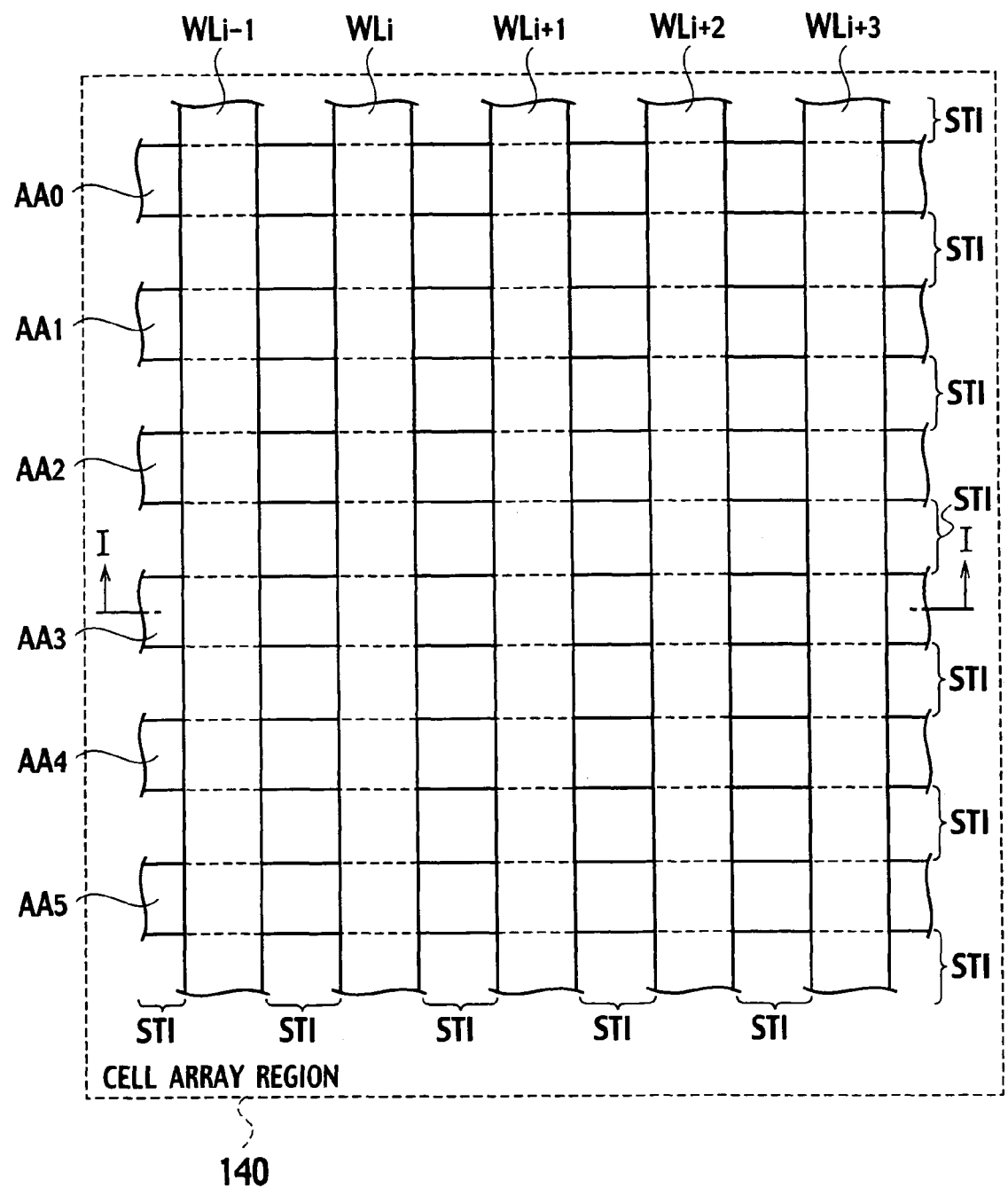
FIG. 15 schematically shows a planar pattern structure in a memory cell array region for describing a process of the nonvolatile semiconductor memory fabrication method according to the first embodiment of the present invention.
Figure 16:
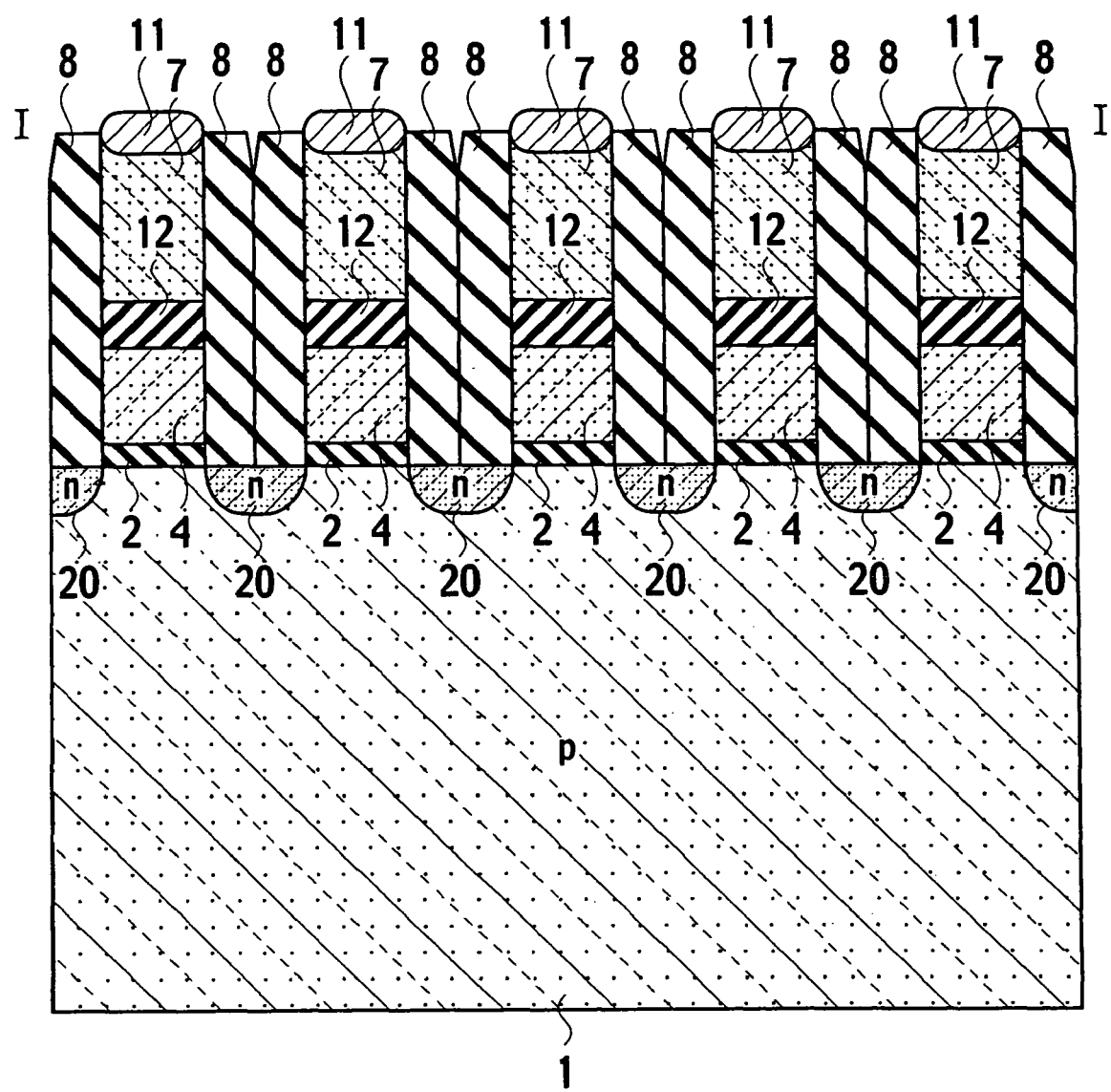
FIG. 16 schematically shows a cross-section of a memory cell transistor for describing a process of the nonvolatile semiconductor memory fabrication method according to the first embodiment of the present invention.

Alternatively, according to the nonvolatile semiconductor memory of the first embodiment of the present invention, the memory cell transistor may further include the metallic salicide films 11, which are electrically in contact with the control gate electrodes 7, as shown in FIGS. 15 and 16.

Alternatively, according to the nonvolatile semiconductor memory of the first embodiment of the present invention, the gate contact (CG) plug 26 may be formed directly over the element isolating region 3, as shown in FIGS. 17 through 19, and 22 through 24. Alternatively, the resistive contact (CR) plug 29 may be formed directly over the element isolating region 3, as shown in FIGS. 26 and 27.

Figure 28:
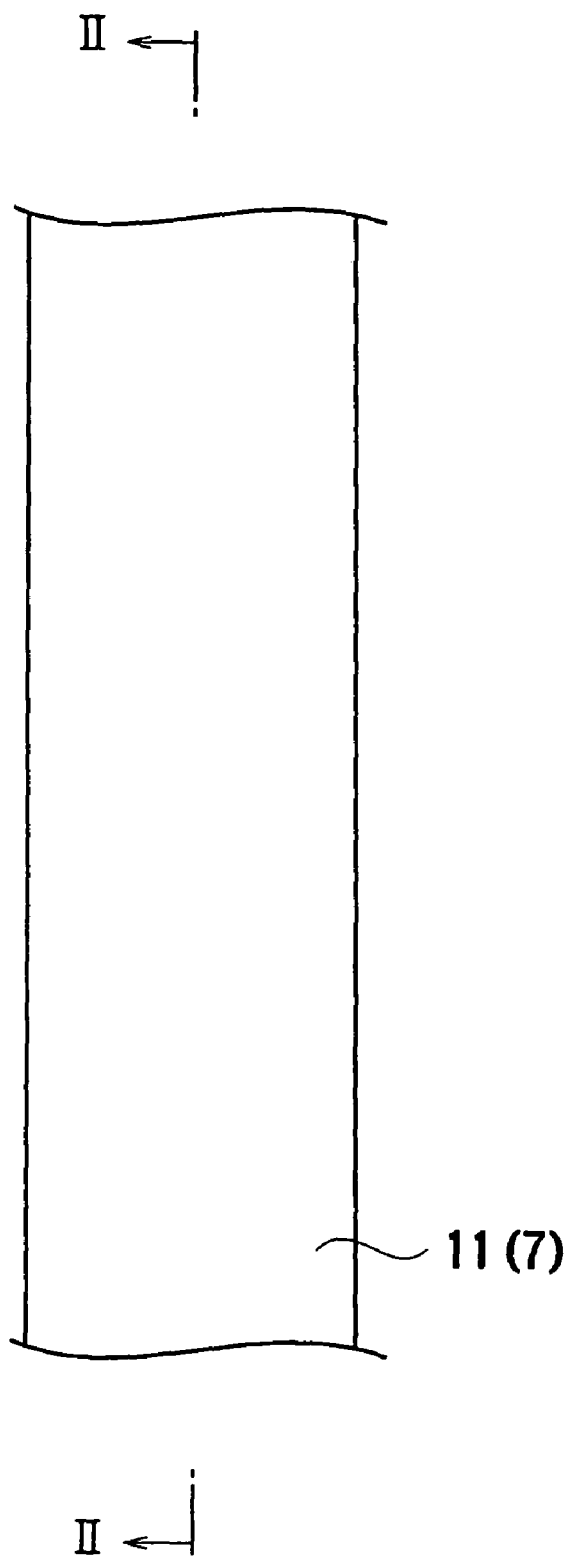
FIG. 28 schematically shows a planar pattern structure of an interconnect region for describing a process of the nonvolatile semiconductor memory fabrication method according to the first embodiment of the present invention.
Figure 29:
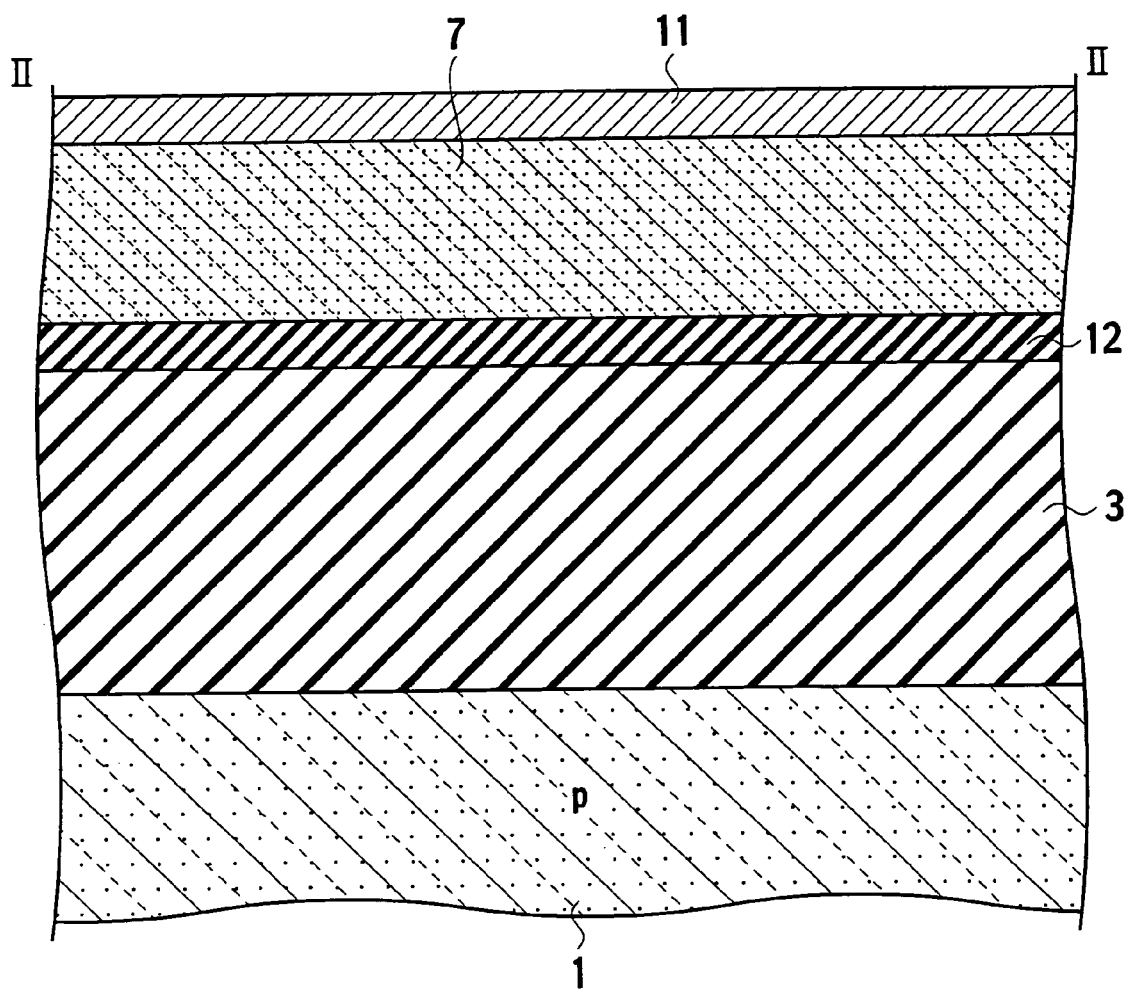
FIG. 29 schematically shows a cross-section cut along the line II-II of FIG. 28.

Alternatively, the nonvolatile semiconductor memory may further include an interconnect region comprising the element isolating region 3, which isolates the cell array region 120, the low voltage circuit regions 80, and the high voltage circuit regions 90, the control gate electrode 7 on the element isolating region 3, and the metallic salicide film 11, which is electrically in contact with the top surface of the control gate electrode 7, as shown in FIGS. 28 and 29.

Figure 20:
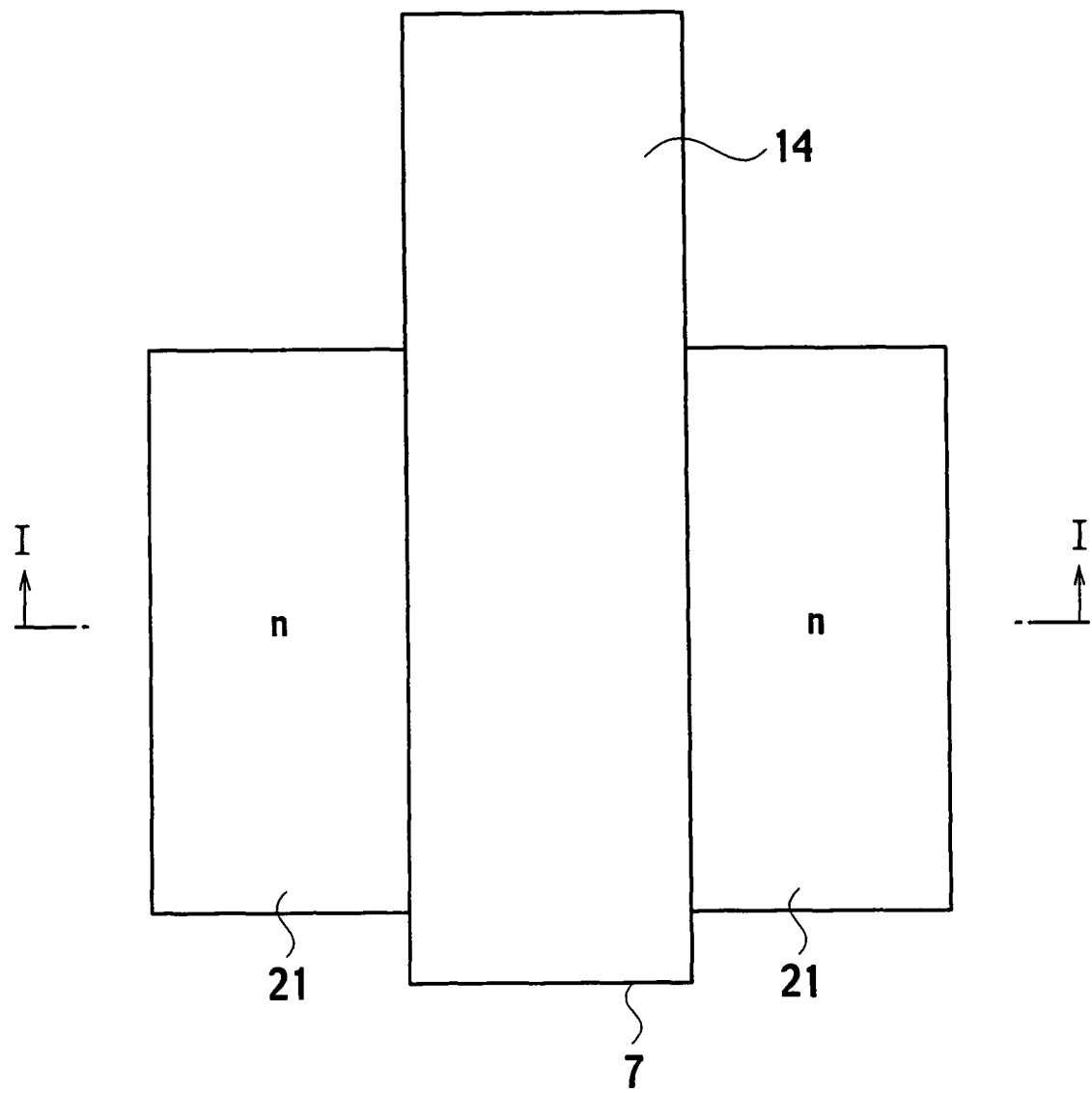
FIG. 20 schematically shows a planar pattern structure of another low voltage transistor for describing a process of the nonvolatile semiconductor memory fabrication method according to the first embodiment of the present invention.
Figure 21:
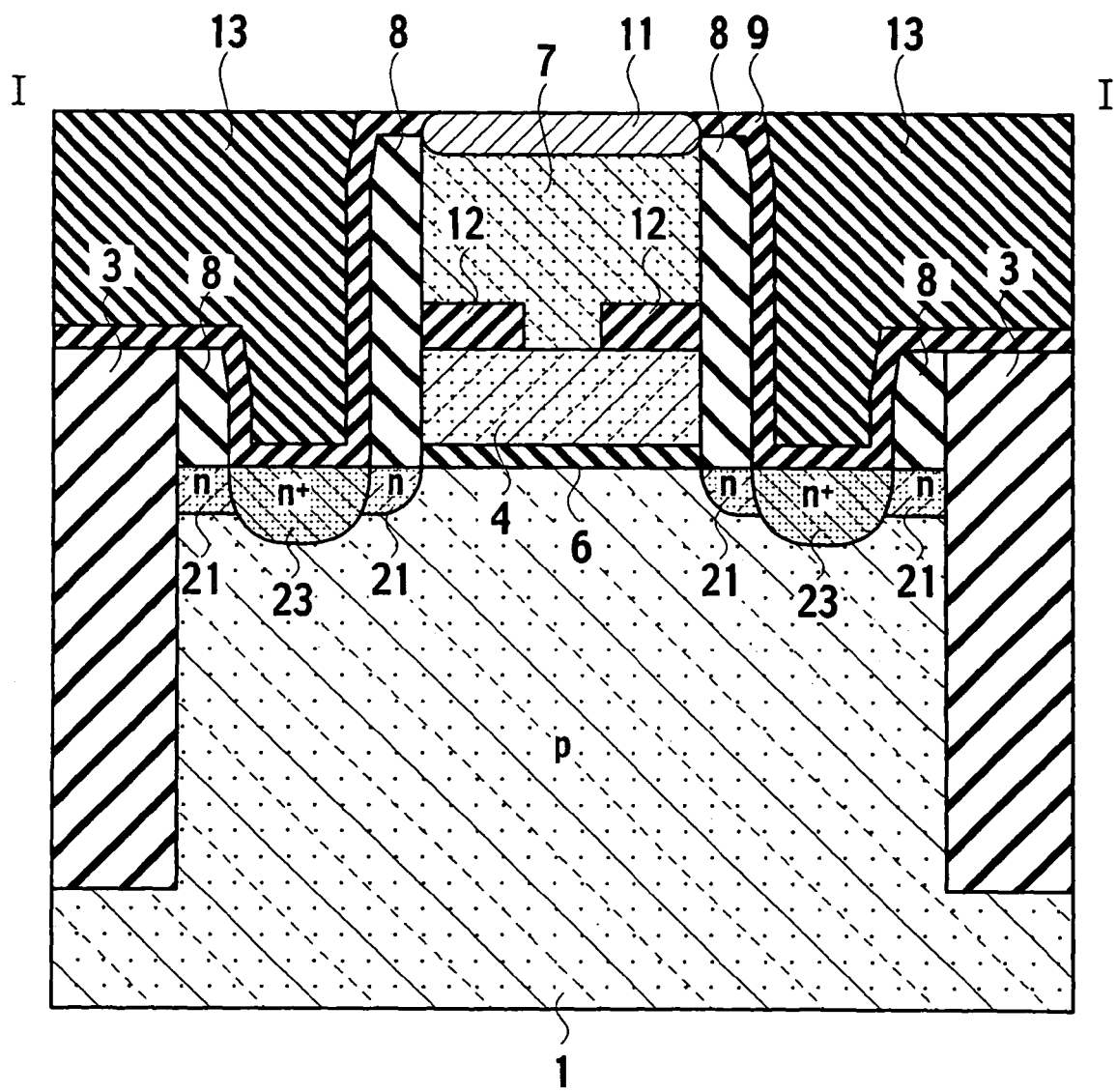
FIG. 21 schematically shows a cross-section cut along the line I-I of FIG. 20.

Alternatively, according to the nonvolatile semiconductor memory, the metallic salicide film 11 is structured to be in electrical contact with the entire top surface of the control gate electrode 7, as shown in FIGS. 20 and 21.

Figure 26:
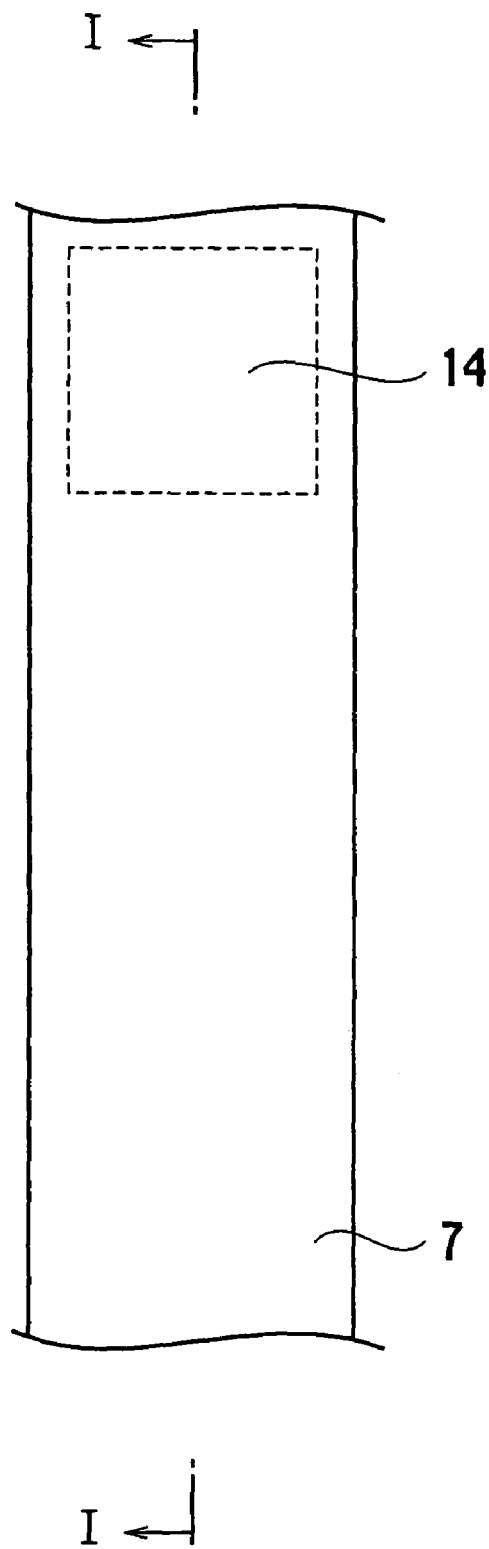
FIG. 26 schematically shows a planar pattern structure of a resistive element for describing a process of the nonvolatile semiconductor memory fabrication method according to the first embodiment of the present invention.

Alternatively, according to the nonvolatile semiconductor memory, the metallic salicide film 11 is structured to be in electrical contact with the entire exposed top surface of the control gate electrode 7, as shown in FIG. 26.

Figure 17:
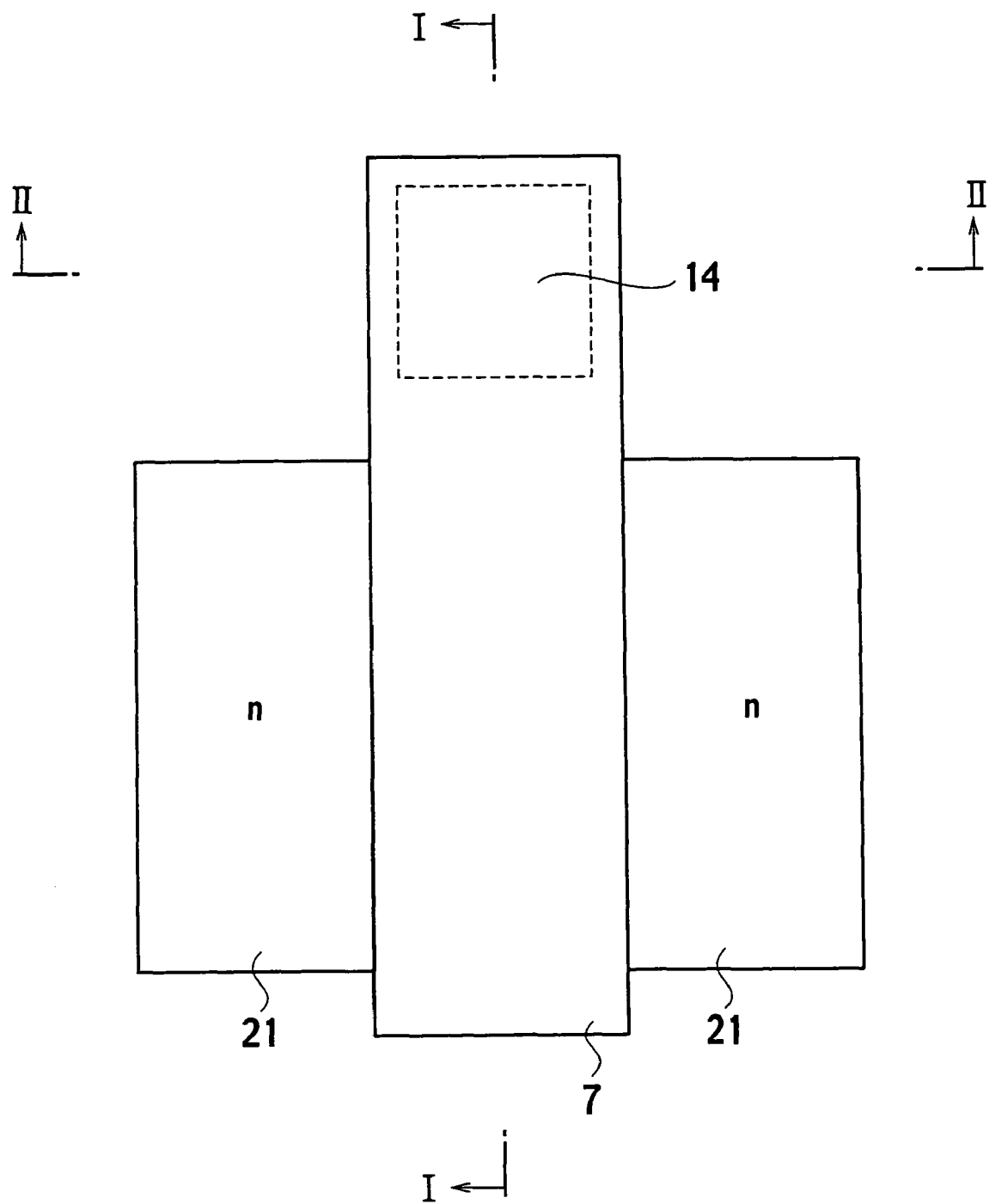
FIG. 17 schematically shows a planar pattern structure of a low voltage transistor for describing a process of the nonvolatile semiconductor memory fabrication method according to the first embodiment of the present invention.
Figure 18:
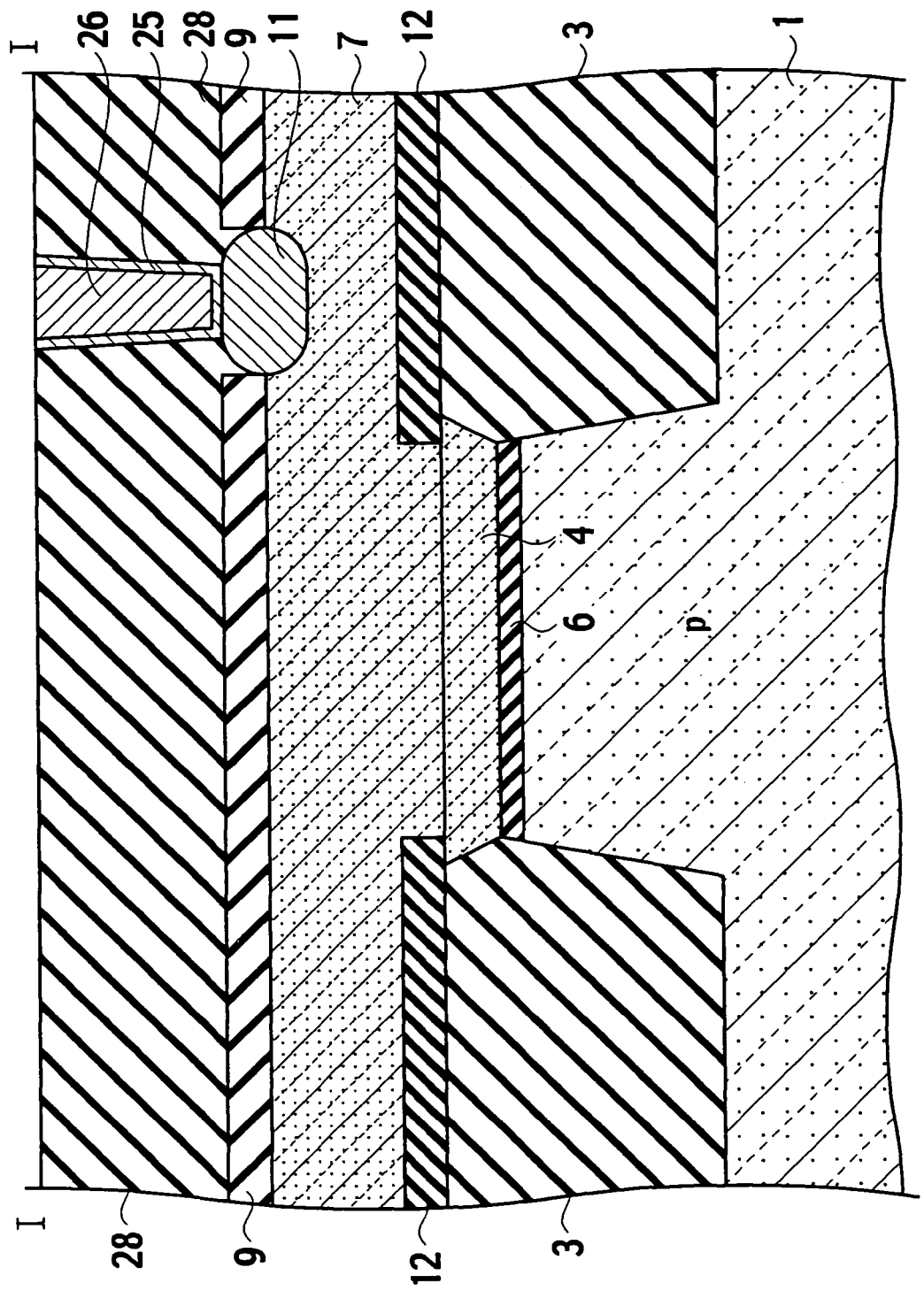
FIG. 18 schematically shows a cross-section cut along the line I-I of FIG. 17.
Figure 19:
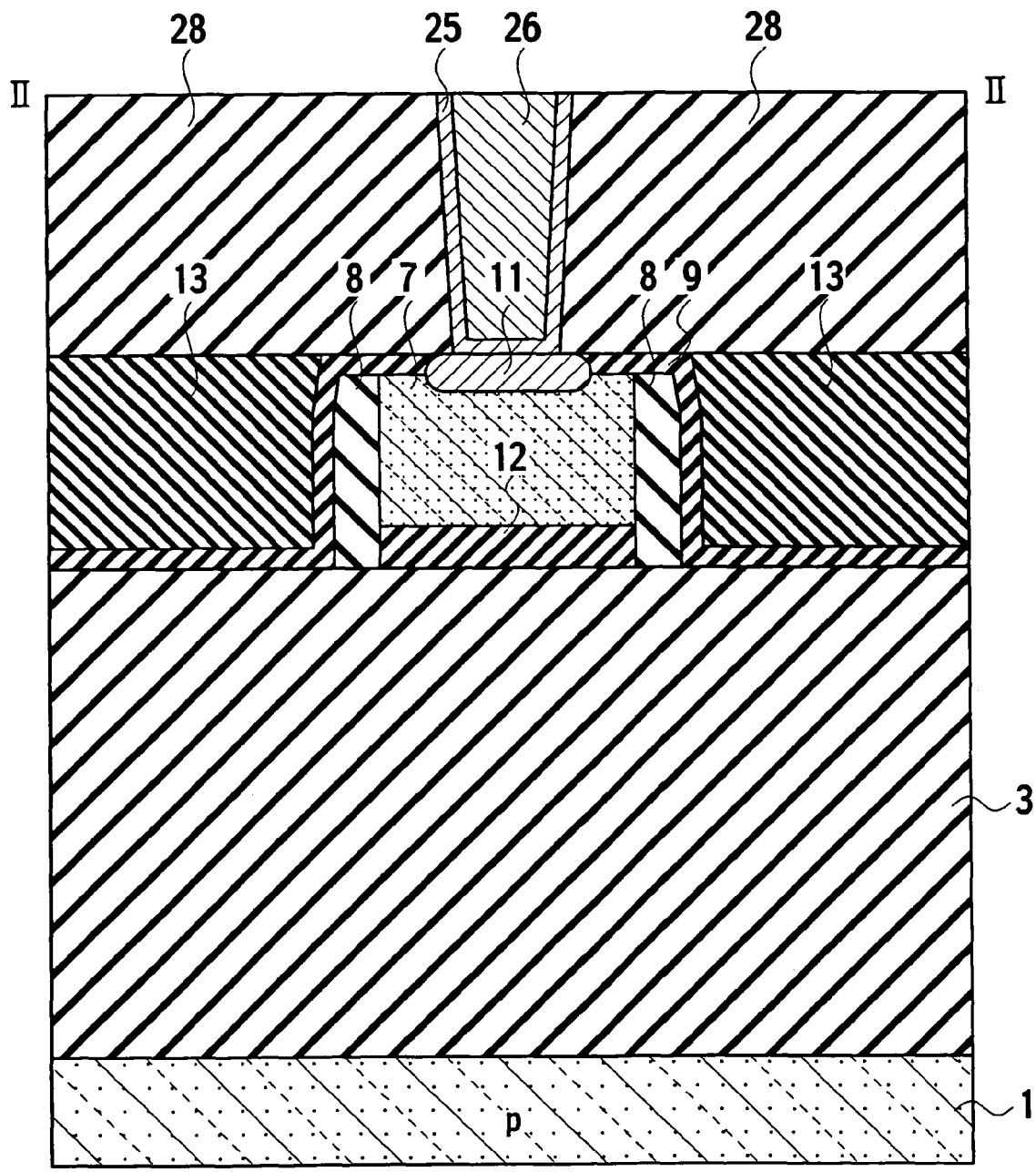
FIG. 19 schematically shows a cross-section cut along the line II-II of FIG. 17.

Alternatively, according to the nonvolatile semiconductor memory, the metallic salicide film 11 may be structured to be in electrical contact with a part of the control gate electrode 7 via a metallic salicide contact region 14 formed on the control gate electrode 7, as shown in FIGS. 17 through 19.

Figure 22:
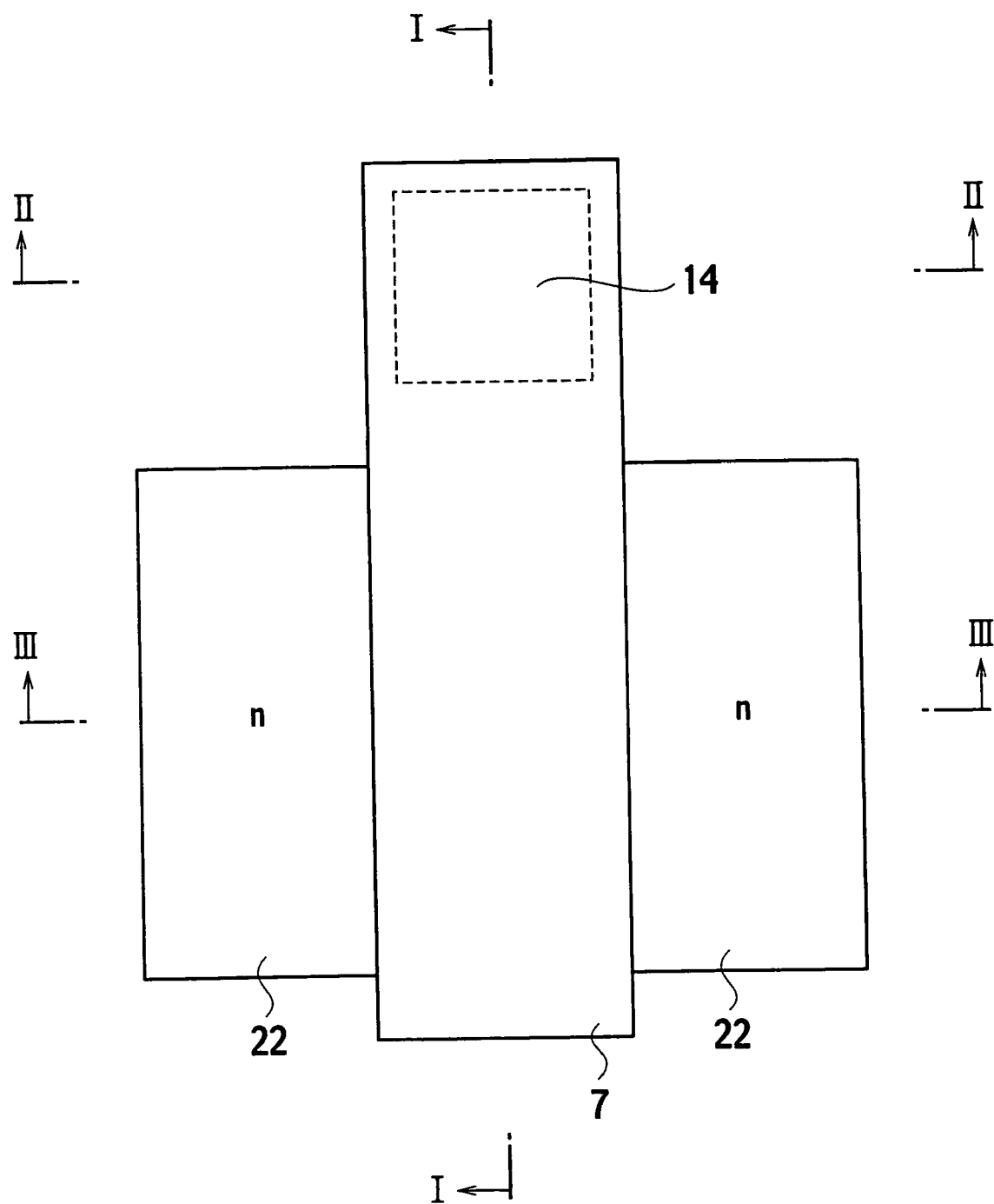
FIG. 22 schematically shows a planar pattern structure of a high voltage transistor for describing a process of the nonvolatile semiconductor memory fabrication method according to the first embodiment of the present invention.
Figure 23:
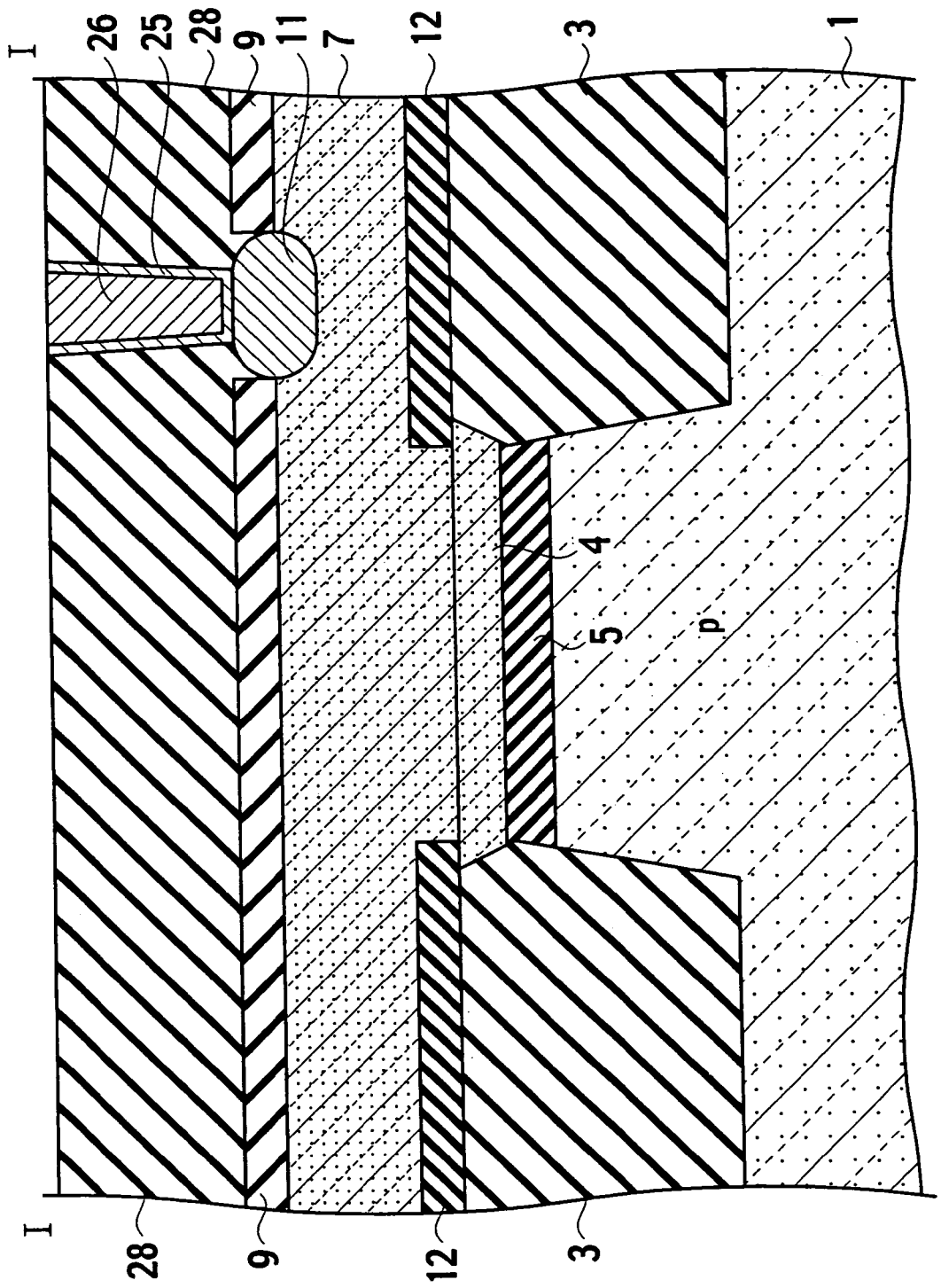
FIG. 23 schematically shows a cross-section cut along the line I-I of FIG. 22.
Figure 24:
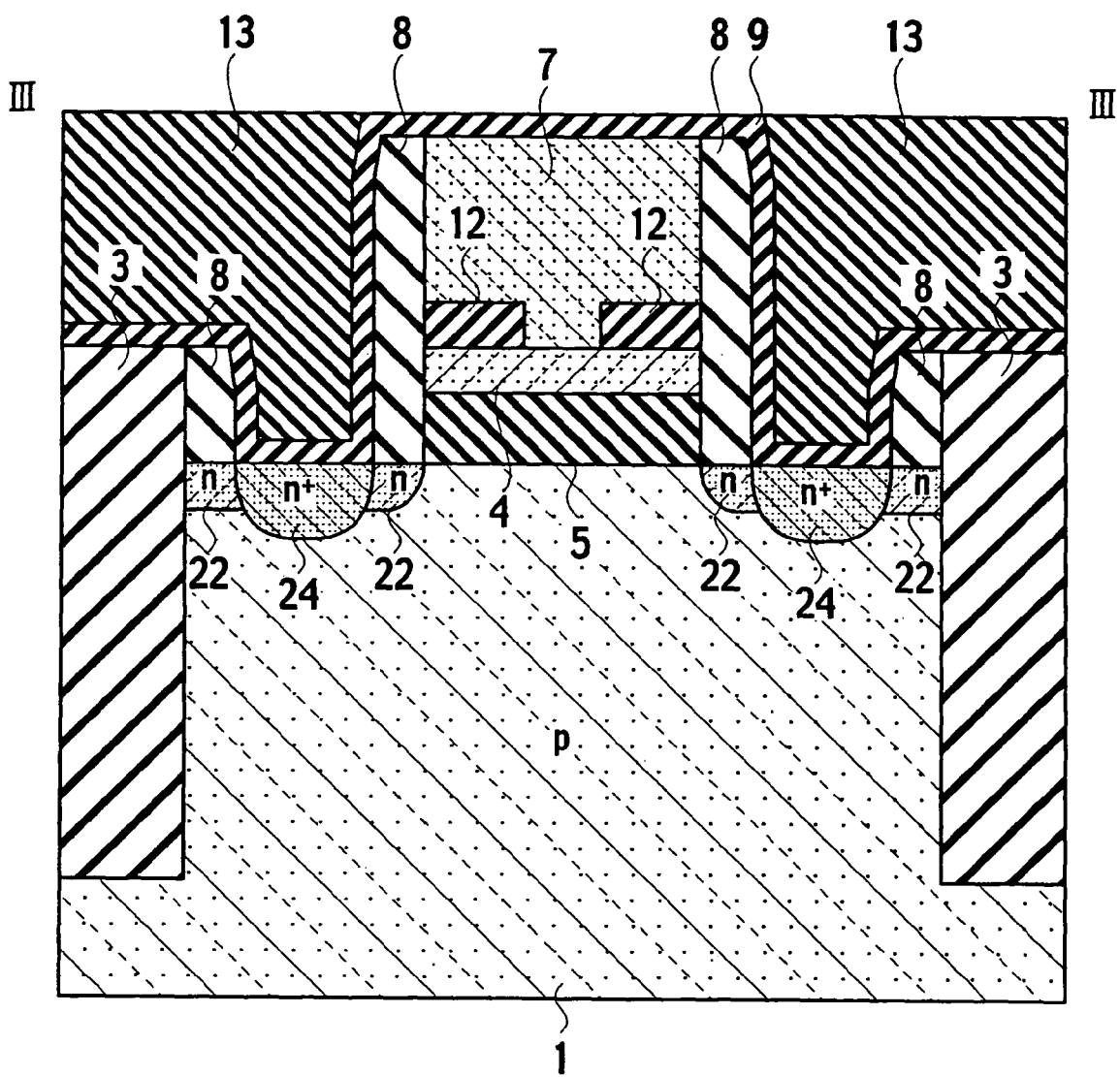
FIG. 24 schematically shows a cross-section cut along the line III-III of FIG. 22.

Alternatively, according to the nonvolatile semiconductor memory, the metallic salicide film 11 may be structured to be in electrical contact with a part of the control gate electrode 7 via a metallic salicide contact region 14 formed on the control gate electrode 7, as shown in FIGS. 22 through 24.

(Memory Cell Transistor)

FIG. 15 schematically shows a planar pattern structure of a memory cell array.

FIG. 16 schematically shows a cross-section of a memory cell transistor cut along the line I-I of FIG. 15. More specifically, FIG. 15 schematically shows a cross-section of a NAND memory cell string on an activation region (AA3) of activation regions AA0, AA1, AA2, AA3, AA5, . . . which extend along the column length and are perpendicular to word lines $WL_{i-1}$, $WL_i$, $WL_{i+1}$, $WL_{i+2}$, $WL_{i+3}$, . . . .

As shown in FIG. 16, a memory cell transistor comprises source and drain regions 20, gate insulating films 2 formed between the source and drain regions 20, floating gate electrodes 4 formed on the gate insulating films 2, control gate electrodes 7 stacked on the floating gate electrodes 4 via first inter-gate insulating films 12, and metallic salicide films 11 which are in electrical contact with the control gate electrodes 7.

The metallic salicide film is a silicide material, such as cobalt (Co), nickel (Ni), titanium (Ti), tantalum (Ta), platinum (Pt), molybdenum (Mo), tungsten (W), or palladium (Pd).

As shown in FIG. 16, a metallic silicide is formed by reaction to only a polysilicon layer. Therefore, the metallic salicide films 11 are formed on only the top surfaces of the control gate electrodes 7, made of polysilicon by reaction with the polysilicon layer, even when a metallic material is formed on the cell array region 140 in FIG. 15. Accordingly, as shown in FIG. 15, the metallic salicide films 11 may be easily formed on only the top surfaces of the control gate electrodes 7, which serve as the word lines $WL_{i-1}$, $WL_i$, $WL_{i+1}$, $WL_{i+2}$, $WL_{i+3}$, . . . , by forming a metallic silicide across the entirety of the cell array region 140.

According to the nonvolatile semiconductor memory of the first embodiment of the present invention, the metallic salicide films 11 are formed on only the top surfaces of the control gate electrodes 7, which serve as the word lines $WL_{i-1}$, $WL_i$, $WL_{i+1}$, $WL_{i+2}$, $WL_{i+3}$, . . . . This structure increases operating speed, improves integration, and permits easy fabrication of a memory cell transistor.

(Low Voltage Transistor)

FIG. 17 schematically shows an exemplary planar pattern structure of a low voltage transistor including a metallic salicide contact region 14 on a part of a control gate electrode 7. In the drawing, only n-type source and drain regions 21 are shown in a diffusion region of the low voltage transistor, and $n^+$-type source and drain regions 23 are omitted.

FIG. 18 schematically shows a cross-section cut along the line I-I of FIG. 17. As shown in FIG. 18, a metallic salicide film 11 is in contact with a part of the control gate electrode 7 formed on element isolating regions 3 via a metallic salicide contact region 14 formed on a part of the control gate electrode 7. In addition, as shown in FIG. 18, the metallic salicide film 11 is connected to a gate contact (CG) plug 26 filled in an interlayer insulating film 28 via a barrier metal 25. The metallic salicide film 11 is formed only directly beneath the gate contact (CG) plug 26.

As schematically shown in FIG. 19, a cross-section cut along the line II-II of FIG. 17 shows an inter-gate insulating film 12 formed on an element isolating region (STI) 3, the control gate electrode 7 stacked on the inter-gate insulating film 12, and the metallic salicide film 11, which is electrically in contact with the control gate electrode 7 via the metallic salicide contact region 14. In addition, as shown in FIG. 19, the metallic salicide film 11 is connected to the gate contact (CG) plug 26 provided in the interlayer insulating film 28 via the barrier metal 25. The metallic salicide film 11 is formed only directly beneath the gate contact (CG) plug 26.

FIG. 20 schematically shows a planar pattern structure of a low voltage transistor. FIG. 21 schematically shows a cross-section cut along the line I-I of FIG. 20.

As shown in FIG. 21, a low voltage transistor comprises source and drain regions 21, a low voltage gate insulating film 6 formed between the source and drain regions 21, a floating gate electrode 4 formed on the low voltage gate insulating film 6, a control gate electrode 7 stacked on the floating gate electrode 4 via the inter-gate insulating film 12 having an opening, and a metallic salicide film 11 in electrical contact with the control gate electrode 7. As is apparent from FIG. 21, in the source and drain regions of the low voltage transistor, n+ type source and drain regions 23 having a deeper junction depth than the n-type source and drain regions 21 are also formed.

According to the nonvolatile semiconductor memory of the first embodiment of the present invention, the metallic salicide film is formed only directly beneath the gate contact of the low voltage transistor. This structure increases operating speed and permits easy fabrication of a low voltage transistor.

(High Voltage Transistor)

FIG. 22 shows an exemplary planar pattern structure of a high voltage transistor including a metallic salicide contact region 14 on a part of a control gate electrode 7. In the drawing, only n-type source and drain regions 22 are shown in diffusion regions of the high voltage transistor, and n+ type source and drain regions 24 are omitted.

FIG. 23 schematically shows a cross-section cut along the line I-I of FIG. 22. As shown in FIG. 23, a metallic salicide film 11 is in contact with a part of the control gate electrode 7, which is formed on element isolating regions 3 via an inter-gate insulating film 12, by forming the metallic salicide contact region 14 on only a part of the control gate electrode 7. In addition, as shown in FIG. 23, the metallic salicide film 11 is connected to a gate contact (CG) plug 26 provided in an interlayer insulating film 28 via a barrier metal 25. The metallic salicide film 11 is formed only directly beneath the gate contact (CG) plug 26.

A cross-section cut along the line II-II of FIG. 22 is schematically illustrated as with FIG. 19, and shows an inter-gate insulating film 12 formed on an element isolating region (STI) 3, a control gate electrode 7 stacked on the inter-gate insulating film 12, and a metallic salicide film 11 in electrical contact with the control gate electrode 7 via the metallic salicide contact region 14.

FIG. 24 schematically shows a cross-section cut along the line III-III of FIG. 22.

As shown in FIG. 24, a high voltage transistor comprises source and drain regions 22, a high voltage gate insulating film 5 formed between the source and drain regions 22, a floating gate electrode 4 formed on the high voltage gate insulating film 5, a control gate electrode 7 stacked on the floating gate electrode 4 via the inter-gate insulating film 12 provided with an opening, and a metallic salicide film 11 in electrical contact with the control gate electrode 7. As is apparent from FIG. 24, in the source and drain regions of the high voltage transistor, n+ type source and drain regions 24 are also formed with a deeper junction depth than the n-type source and drain regions 22.

Figure 25:
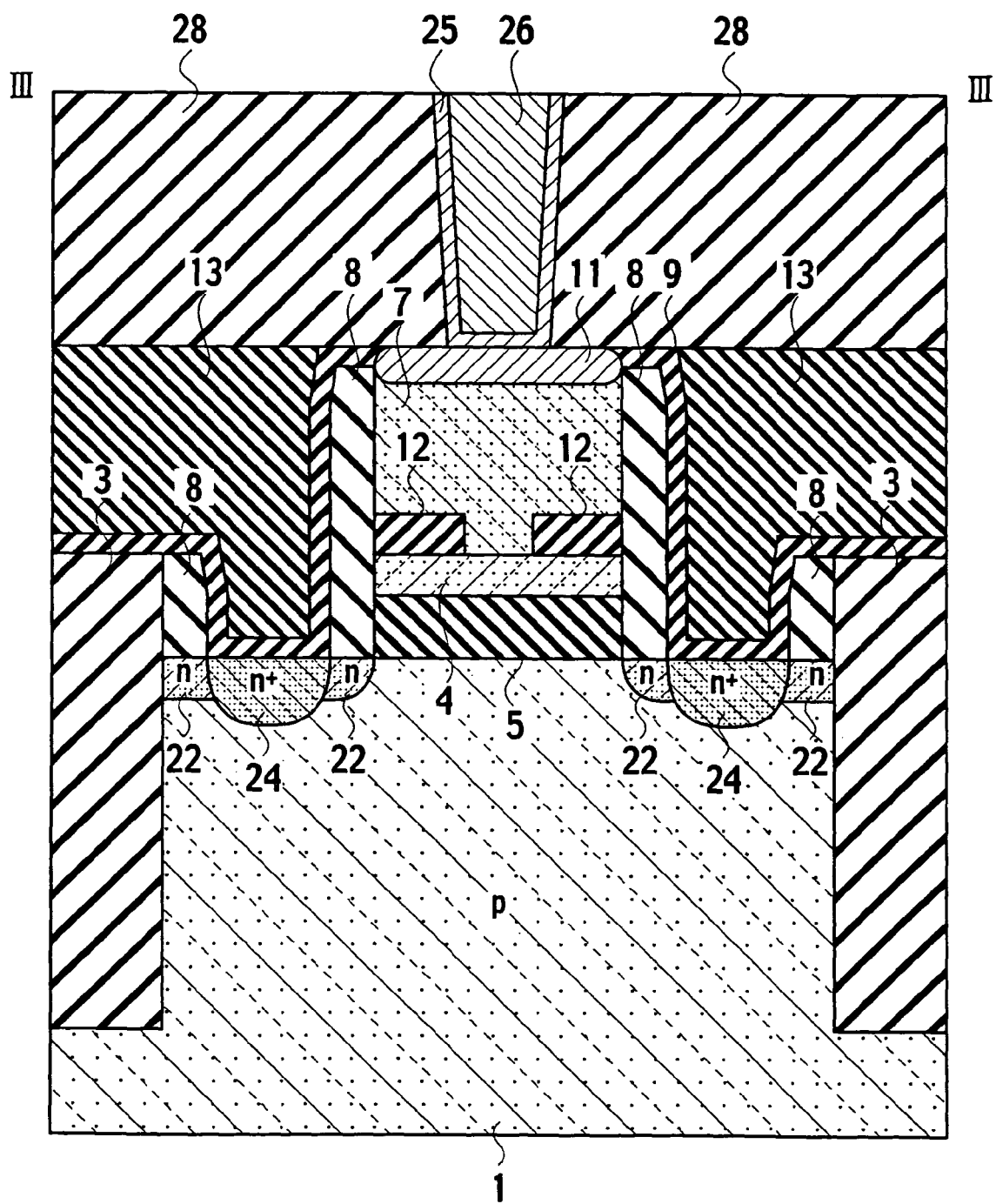
FIG. 25 schematically shows a cross-section of another high voltage transistor cut along the line III-III of FIG. 22, which includes a metallic salicide contact region 14 on the entire top surface of a control gate electrode 7 as with the structure in FIG. 20.

FIG. 25 schematically shows a cross-section of a high voltage transistor cut along the line III-III of FIG. 22, which is different from that of FIG. 24; where the high voltage transistor includes the metallic salicide contact region 14 across the entire top surface of the control gate electrode 7 as with FIG. 20.

The high voltage transistor shown in FIG. 25 comprises source and drain regions 22, a high voltage gate insulating film 5 formed between the source and drain regions 22, a floating gate electrode 4 formed on the high voltage gate insulating film 5, a control gate electrode 7 stacked via the inter-gate insulating film 12 provided with an opening on the floating gate electrode 4, a metallic salicide film 11 in electrical contact with the control gate electrode 7, and a gate contact (CG) plug 26 in contact with the metallic salicide film 11 via a barrier metal 25. The barrier metal 25 and the gate contact (CG) plug 26 are provided in an interlayer insulating film 28 by a typical electrode forming process, such as the damascene process. The metallic salicide film 11 is formed only directly beneath the gate contact (CG) plug 26. According to the exemplary structure of FIG. 25, the gate contact (CG) plug 26 is not formed directly over the element isolating region 3, but is formed directly over an activation region.

According to the nonvolatile semiconductor memory of the first embodiment of the present invention, the metallic salicide film is formed only directly beneath the gate contact of the high voltage transistor. This structure increases breakdown voltage and operating speed, and provides easy fabrication of a high voltage transistor.

(Resistive Element)

FIG. 26 schematically shows a planar pattern structure of a resistive element region where a metallic salicide contact region 14 is formed on a part of a control gate electrode 7. FIG. 27 schematically shows a cross-section cut along the line I-I of FIG. 26.

As shown in FIGS. 26 and 27, a resistive element comprises an element isolating region 3, an inter-gate insulating film 12 formed on the element isolating region 3, a control gate electrode 7 formed on the inter-gate insulating film 12, and a metallic salicide film 11 electrically in contact with the top surface of the control gate electrode 7 via a metallic salicide contact region 14. In addition, as shown in FIG. 27, the metallic salicide film 11 is connected to a resistive contact (CR) plug 29 provided in an interlayer insulating film 28 via a barrier metal 25. The metallic salicide film 11 is formed only directly beneath the resistive contact (CR) plug 29.

As shown in FIG. 26, formation of the polysilicon control gate electrode 7, in a stripe shape, and control of resistivity thereof provides a resistive element.

According to the nonvolatile semiconductor memory of the first embodiment of the present invention, the metallic salicide film is formed only directly beneath the gate contact of the control gate electrode 7 of a resistive element. This structure increases operating speed and permits easy fabrication of a resistive element.

(Interconnect Region)

FIG. 28 schematically shows a planar pattern structure of an interconnect region where a metallic salicide contact region 14 is formed across the entire surface of a control gate electrode 7. FIG. 29 schematically shows a cross-section cut along the line II-II of FIG. 28.

As shown in FIGS. 28 and 29, an interconnect region comprises an element isolating region 3, an inter-gate insulating film 12 formed on the element isolating region 3, a control gate electrode 7 formed on the inter-gate insulating film 12, and a metallic salicide film 11 in electrical contact with the entire top surface of the control gate electrode 7. As shown in FIG. 28, formation of the polysilicon control gate electrode 7, in a stripe shape, provides an interconnect region.

According to the structure of FIG. 28, the inter-gate insulating film 12, formed on the element isolating region 3, is not always needed, and may be removed through etching or the like. In such a case, the control gate electrode 7 is directly formed on the element isolating region 3.

According to the nonvolatile semiconductor memory of the first embodiment of the present invention, the metallic salicide film is formed across the entire surface of the control gate electrode 7 constituting an interconnect region. This structure increases operating speed and permits easy fabrication of an interconnect region.

(Fabrication Method)

(A) Gate Fabrication Process

Figure 3:
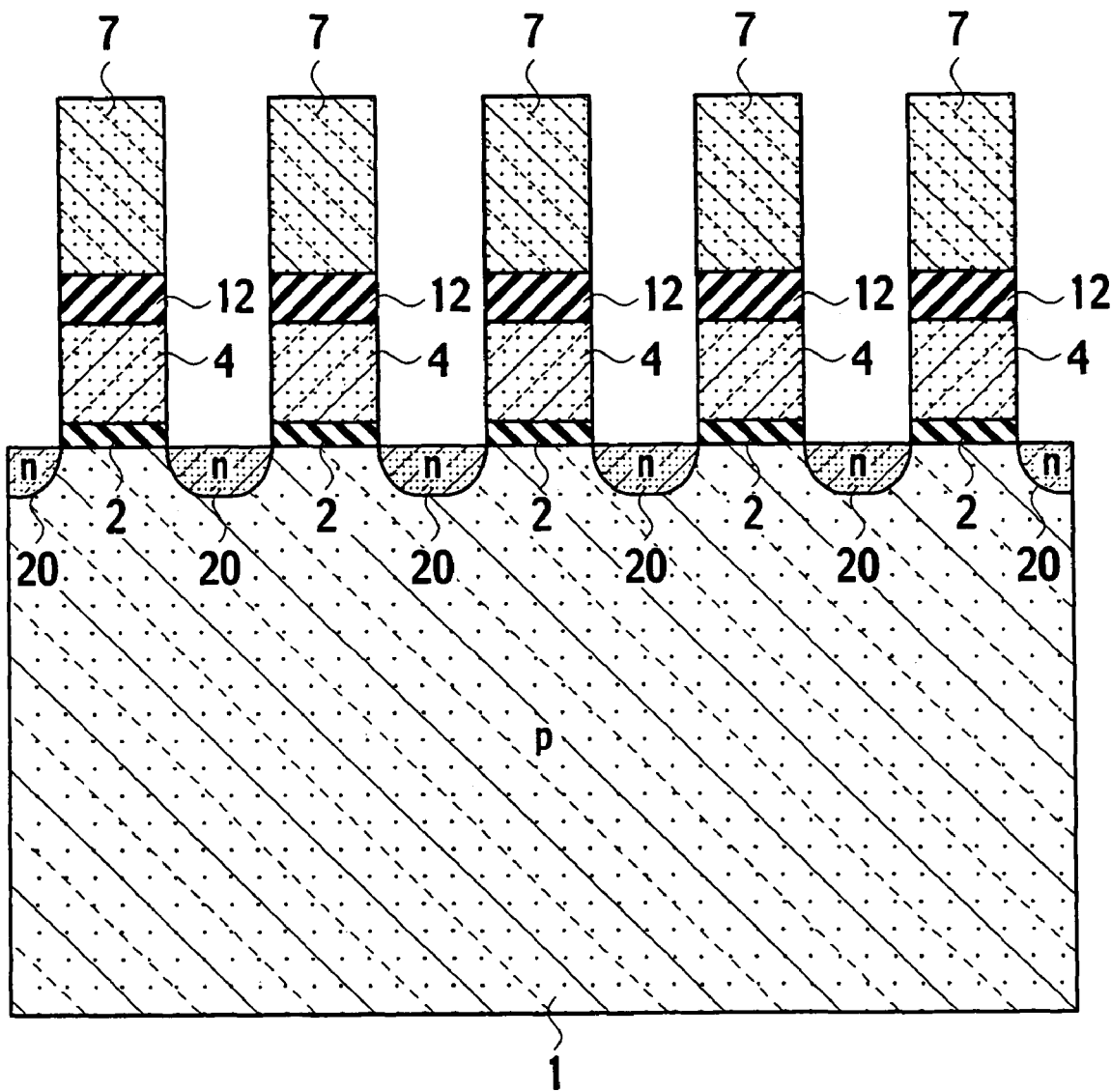
FIG. 3 schematically shows a cross-section of a memory cell transistor for describing a process of a nonvolatile semiconductor memory fabrication method according to the first embodiment of the present invention.
Figure 4:
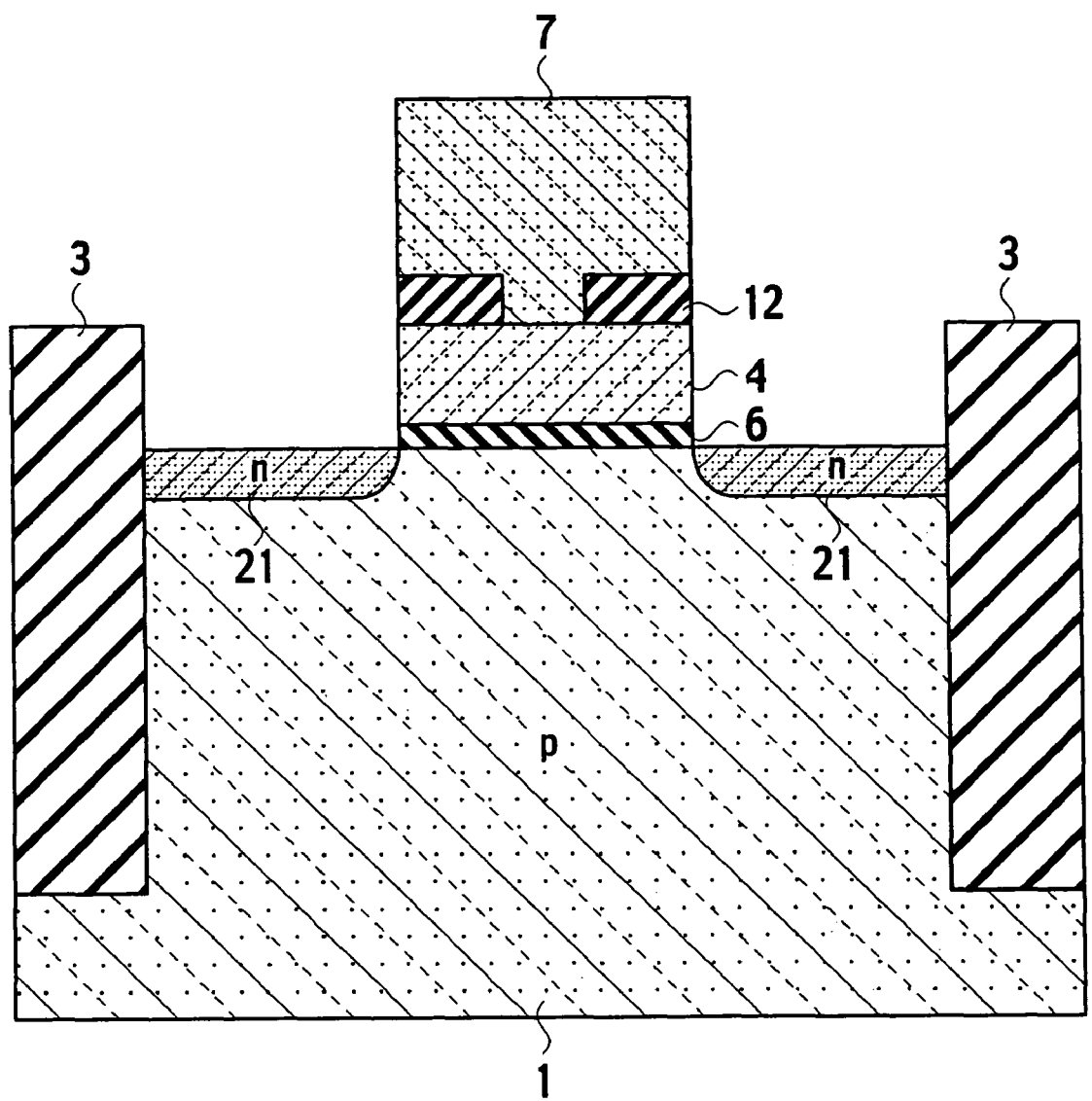
FIG. 4 schematically shows a cross-section of a low voltage transistor for describing a process of the nonvolatile semiconductor memory fabrication method according to the first embodiment of the present invention.
Figure 5:
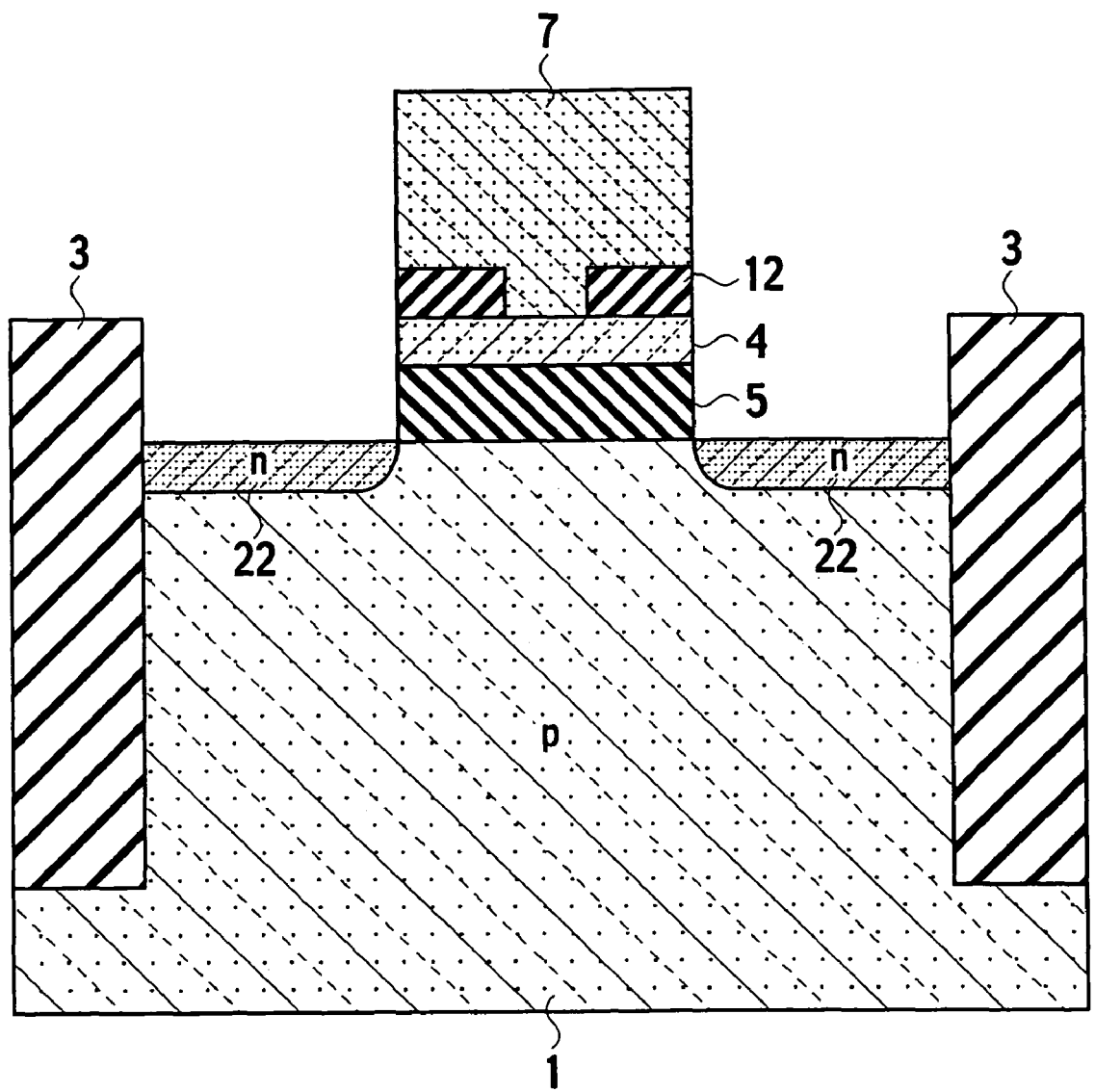
FIG. 5 schematically shows a cross-section of a high voltage transistor for describing a process of the nonvolatile semiconductor memory fabrication method according to the first embodiment of the present invention.
Figure 6:
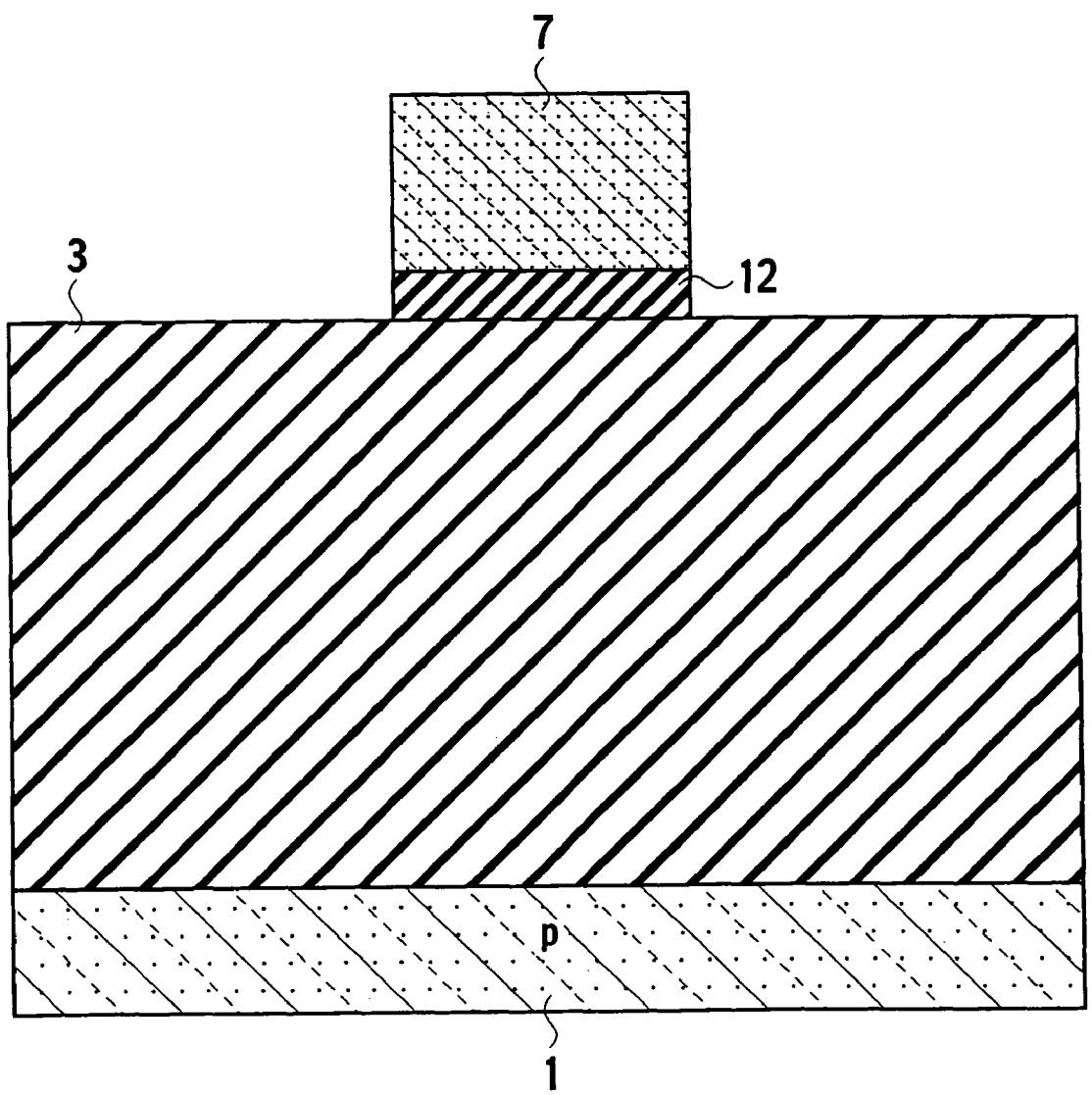
FIG. 6 schematically shows a cross-section of a resistive element for describing a process of the nonvolatile semiconductor memory fabrication method according to the first embodiment of the present invention.

FIGS. 3 through 6 show cross sections of respective elements in a NAND flash memory after the gate of each element has been processed. More specifically, FIG. 3 schematically shows a cross-section of a memory cell transistor; FIG. 4 schematically shows a cross-section of a low voltage transistor; FIG. 5 schematically shows a cross-section of a high voltage transistor.; and FIG. 6 schematically shows a cross-section of a resistive element.

(a) A high voltage gate insulating film 5 of a high voltage transistor is formed first.

(b) A gate insulating film 2 of a memory cell transistor and a low voltage gate insulating film 6 of a low voltage transistor are then formed in a memory cell array region and a low voltage circuit region, respectively.

(c) A floating gate polysilicon layer is deposited on the gate insulating film 2 of the memory cell transistor, the low voltage gate insulating film 6 of the low voltage transistor, and the high voltage gate insulating film 5 of the high voltage transistor, forming a floating gate electrode 4.

(d) An element isolating region 3 is formed. Here, needless to say, the element isolating region 3 is also formed in the memory cell array region for isolating elements between activation regions. Since FIG. 3 is a cross-section of the activation region along the column length, the element isolating region 3 does not appear.

(e) An inter-gate insulating film 12 is then deposited across the entirety of the memory cell transistor, the low voltage transistor, the high voltage transistor, and the resistive element.

(f) openings are formed in parts of the respective inter-gate insulating films 12 formed on the floating gate electrode 4 of the low voltage transistor and the high voltage transistor through etching (g) A control gate polysilicon layer is then deposited on the inter-gate insulating film of the memory cell transistor, the inter-gate insulating films of the high voltage transistor and the low voltage transistor having respective openings, and the inter-gate insulating film 12 of the resistive element.

(h) A stacked gate structure of each memory cell transistor is formed including the control gate electrode 7, the inter-gate insulating film 12, the floating gate electrode 4, and the gate insulating film 2, by lithography and etching. Similarly, a stacked gate structure of the low voltage transistor is formed including the control gate electrode 7, the inter-gate insulating film 12 having an opening, the floating gate electrode 4, and the gate insulating film 6. Similarly, a stacked gate structure of the high voltage transistor is formed including the control gate electrode 7, the inter-gate insulating film 12 having an opening, the floating gate electrode 4, and the gate insulating film 5. Similarly, a stacked structure of the resistive element is formed including the control gate electrode 7 and the inter-gate insulating film 12 formed on the element isolating region 3.

(i) N-type source and drain regions 20 of the memory cell transistor, n-type source and drain regions 21 of the low voltage transistor, and n-type source and drain regions 22 of the high voltage transistor are formed by ion implantation and thermal treatment, providing the respective structures shown in FIGS. 3 through 6.

Figure 7:
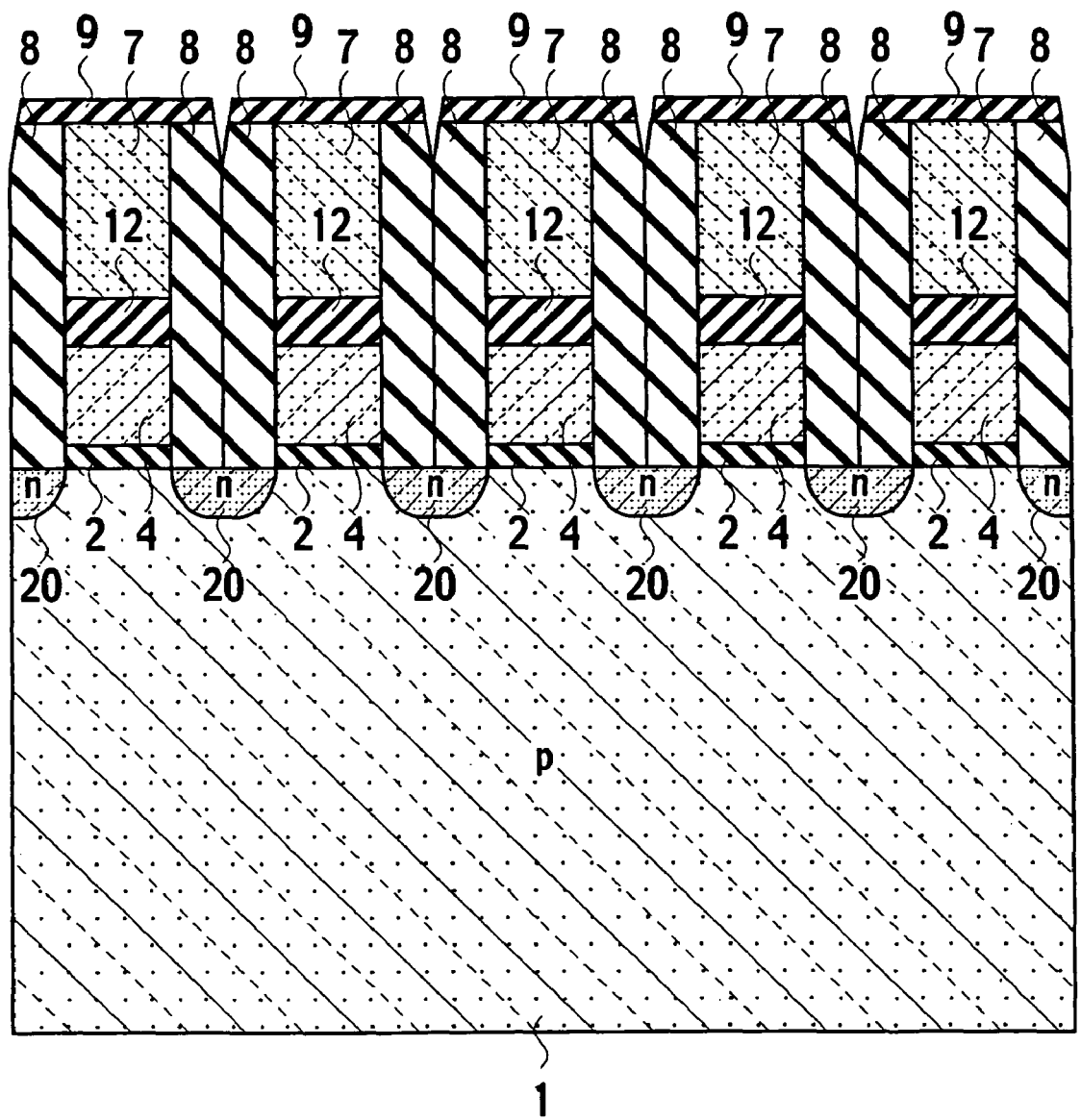
FIG. 7 schematically shows a cross-section of a memory cell transistor for describing a process of the nonvolatile semiconductor memory fabrication method according to the first embodiment of the present invention.
Figure 8:
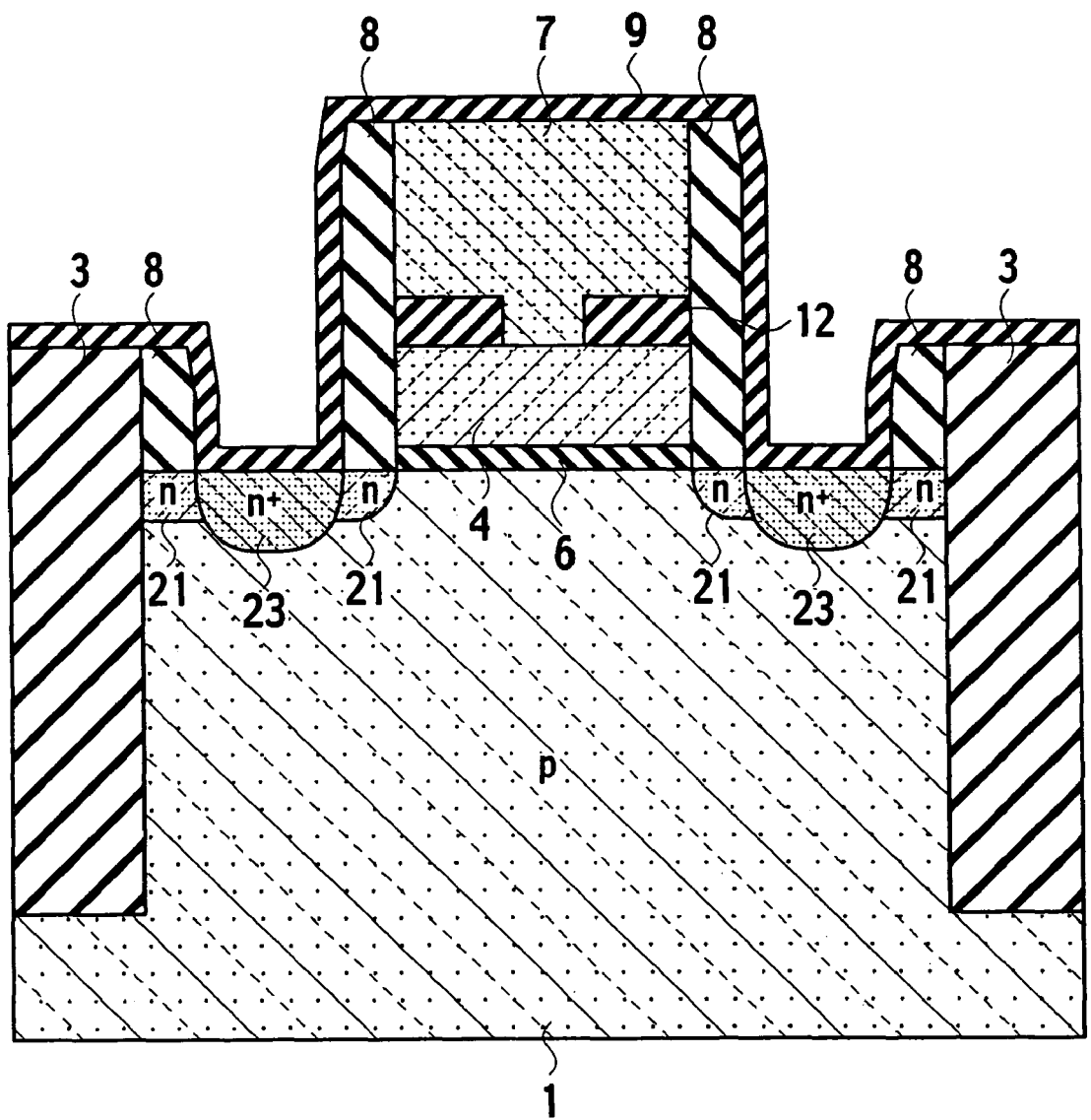
FIG. 8 schematically shows a cross-section of a low voltage transistor for describing a process of the nonvolatile semiconductor memory fabrication method according to the first embodiment of the present invention.
Figure 9:
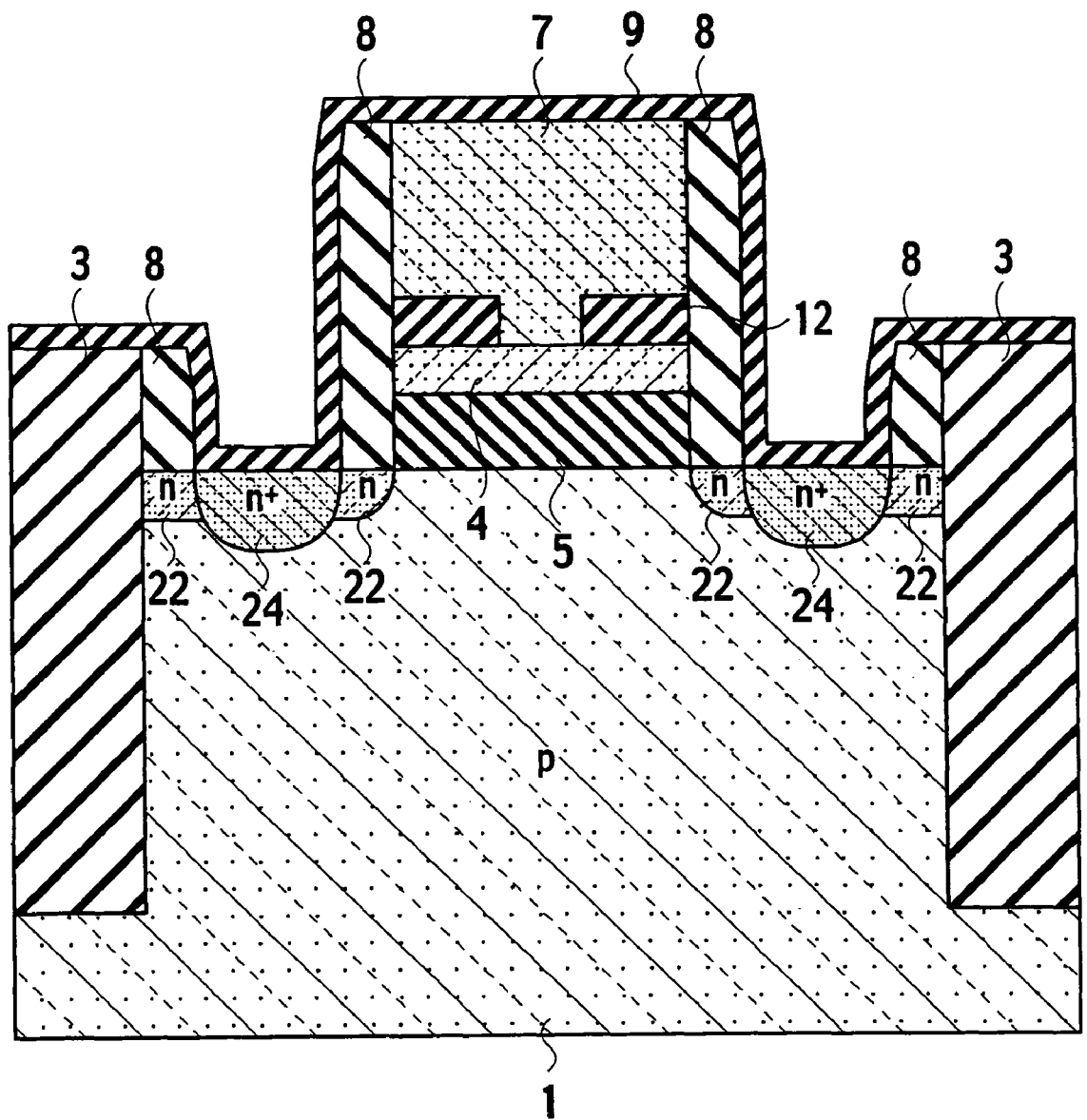
FIG. 9 schematically shows a cross-section of a high voltage transistor for describing a process of the nonvolatile semiconductor memory fabrication method according to the first embodiment of the present invention.
Figure 10:
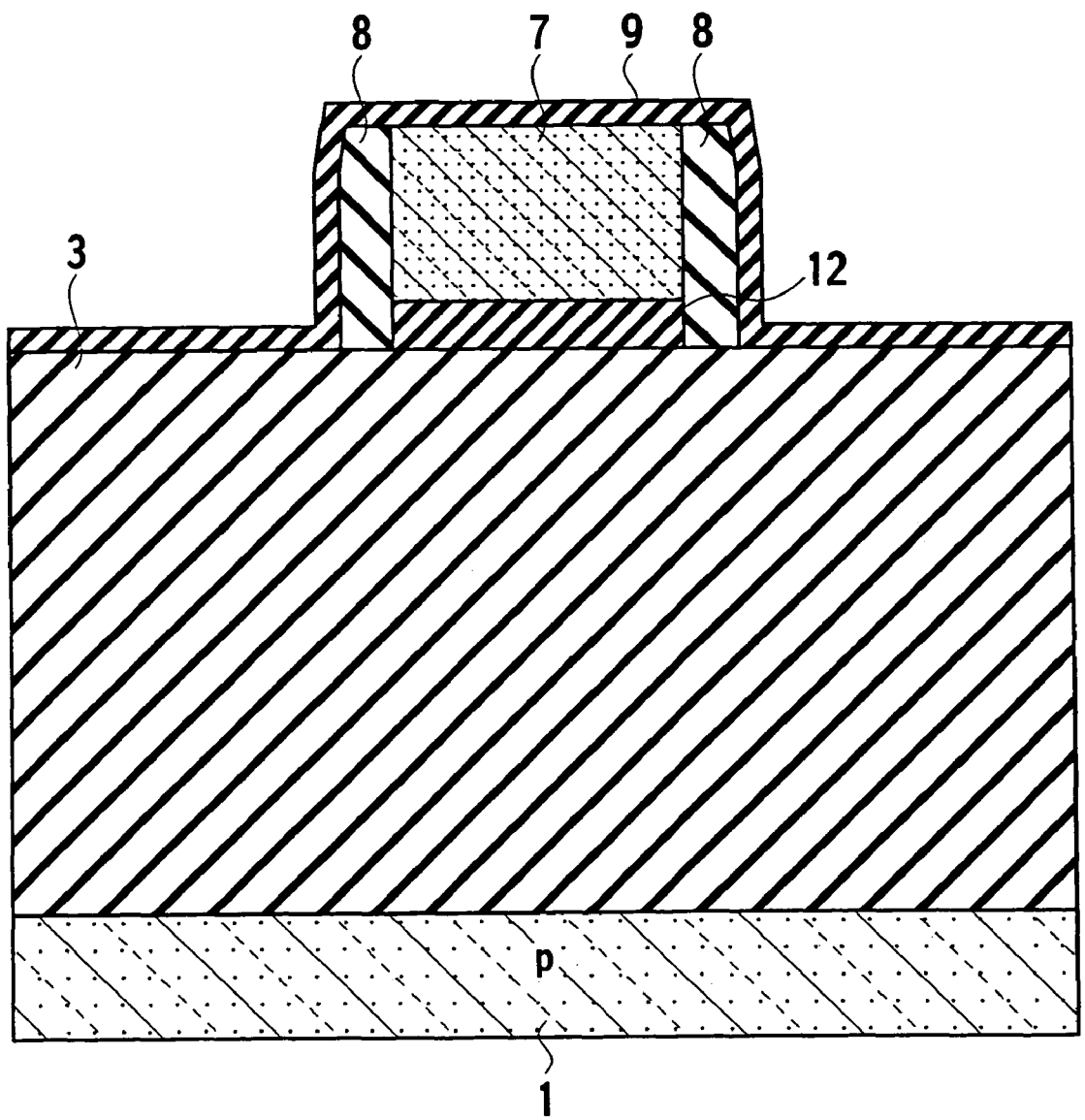
FIG. 10 schematically shows a cross-section of a resistive element for describing a process of the nonvolatile semiconductor memory fabrication method according to the first embodiment of the present invention.

(B) Sidewall Insulating Layer 8 and Liner Insulating Film 9 Formation Process FIGS. 7 through 10 show cross-sections of sidewall insulating films 8 and liner insulating films 9 formed after the gate of each element of the NAND flash memory shown in FIGS. 3 through 6 has been processed. More specifically, FIG. 7 schematically shows a cross-section of a memory cell transistor; FIG. 8 schematically shows a cross-section of a low voltage transistor; FIG. 9 schematically shows a cross-section of a high voltage transistor; and FIG. 10 schematically shows a cross-section of a resistive element. It is desirable that the sidewall insulating films 8 and the liner insulating films 9 are insulating films having an etch selectivity against the floating gate electrodes 4 and the control gate electrodes 7. In addition, it is desirable that the liner insulating films 9 are insulating films having an etch selectivity against the sidewall insulating films 8, and may have a stacked structure.

(j) Following the processes shown in FIGS. 3 through 6, the sidewall insulating films 8, made of an oxide film or the like, are deposited across the entirety of the memory cell transistor, the low voltage transistor, the high voltage transistor, and the resistive element.

(k) Respective gate sidewall structures of the memory cell transistor, the low voltage transistor, the high voltage transistor, and the resistive element are formed by selective etching. At this time, openings are formed in parts of the respective source and drain regions of the low voltage transistor and the high voltage transistor.

(l) n+ type source and drain regions 23 of the low voltage transistor and n+ type source and drain regions 24 of the high voltage transistor are formed by ion implantation and thermal treatment.

(m) The liner insulating films 9, made of a nitride film or the like, are deposited across the entirety of the memory cell transistor, the low voltage transistor, the high voltage transistor, and the resistive element, providing the respective structures shown in FIGS. 7 through 10.

Figure 11:
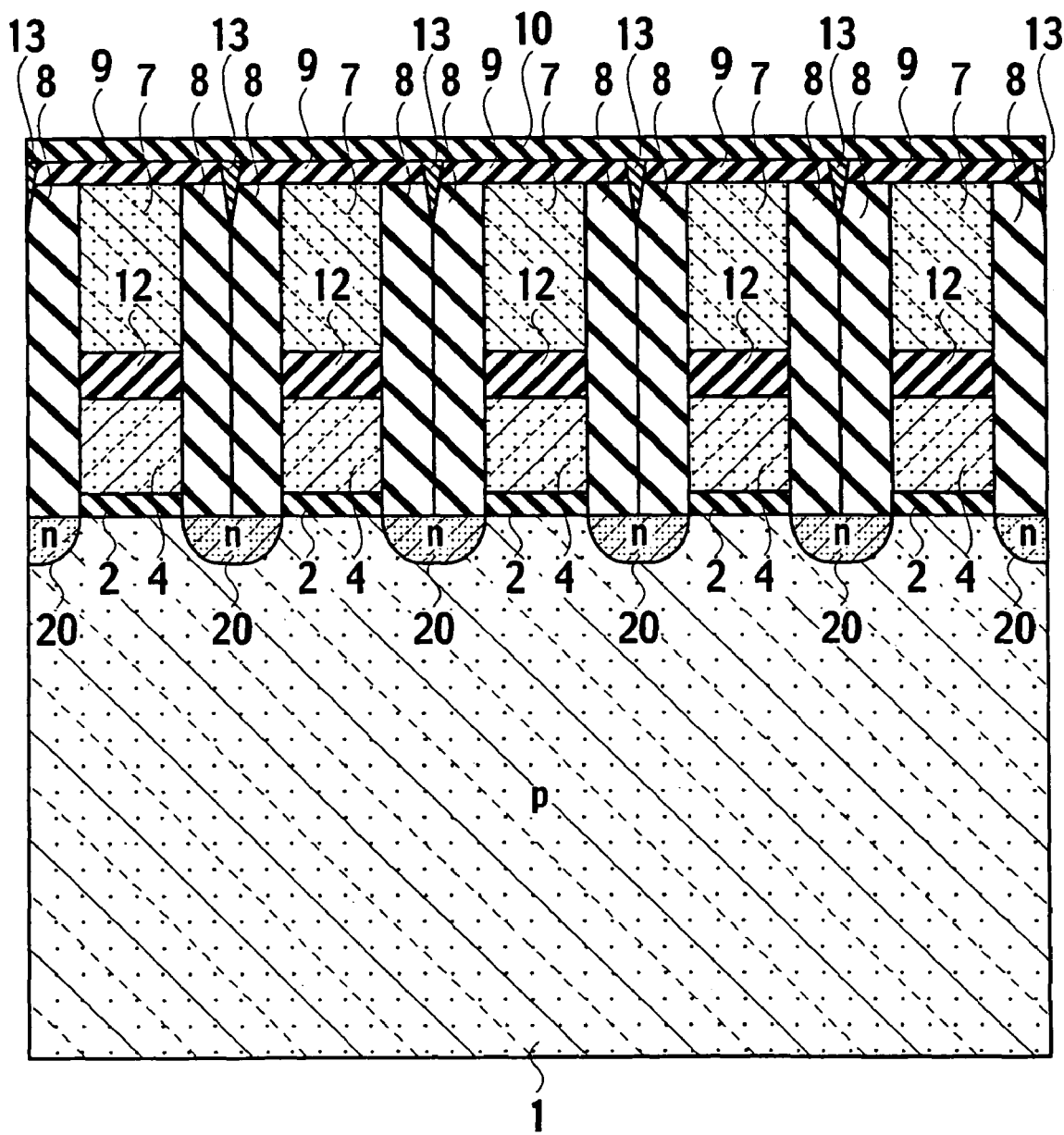
FIG. 11 schematically shows a cross-section of a memory cell transistor for describing a process of the nonvolatile semiconductor memory fabrication method according to the first embodiment of the present invention.
Figure 12:
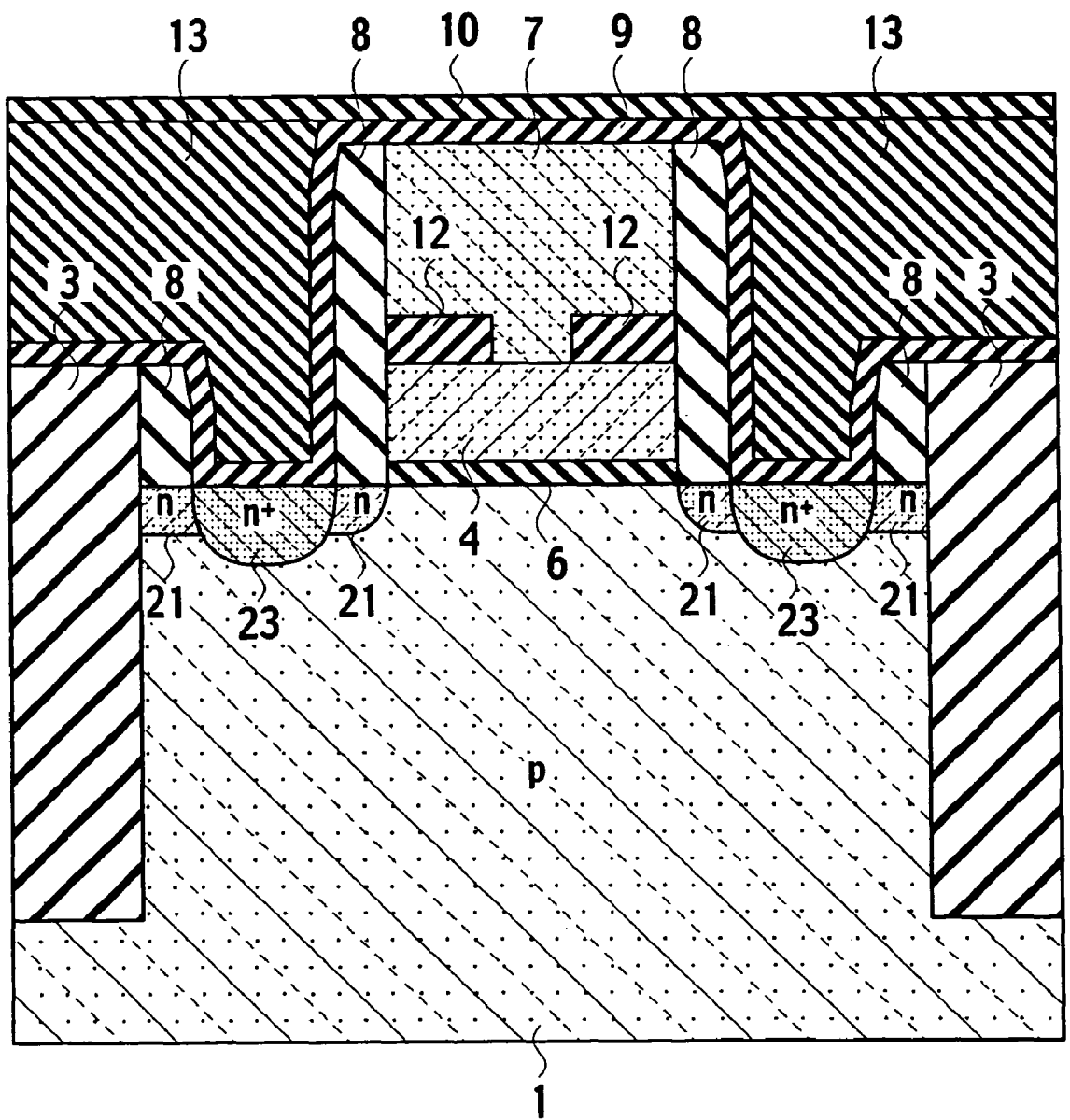
FIG. 12 schematically shows a cross-section of a low voltage transistor for describing a process of the nonvolatile semiconductor memory fabrication method according to the first embodiment of the present invention.
Figure 13:
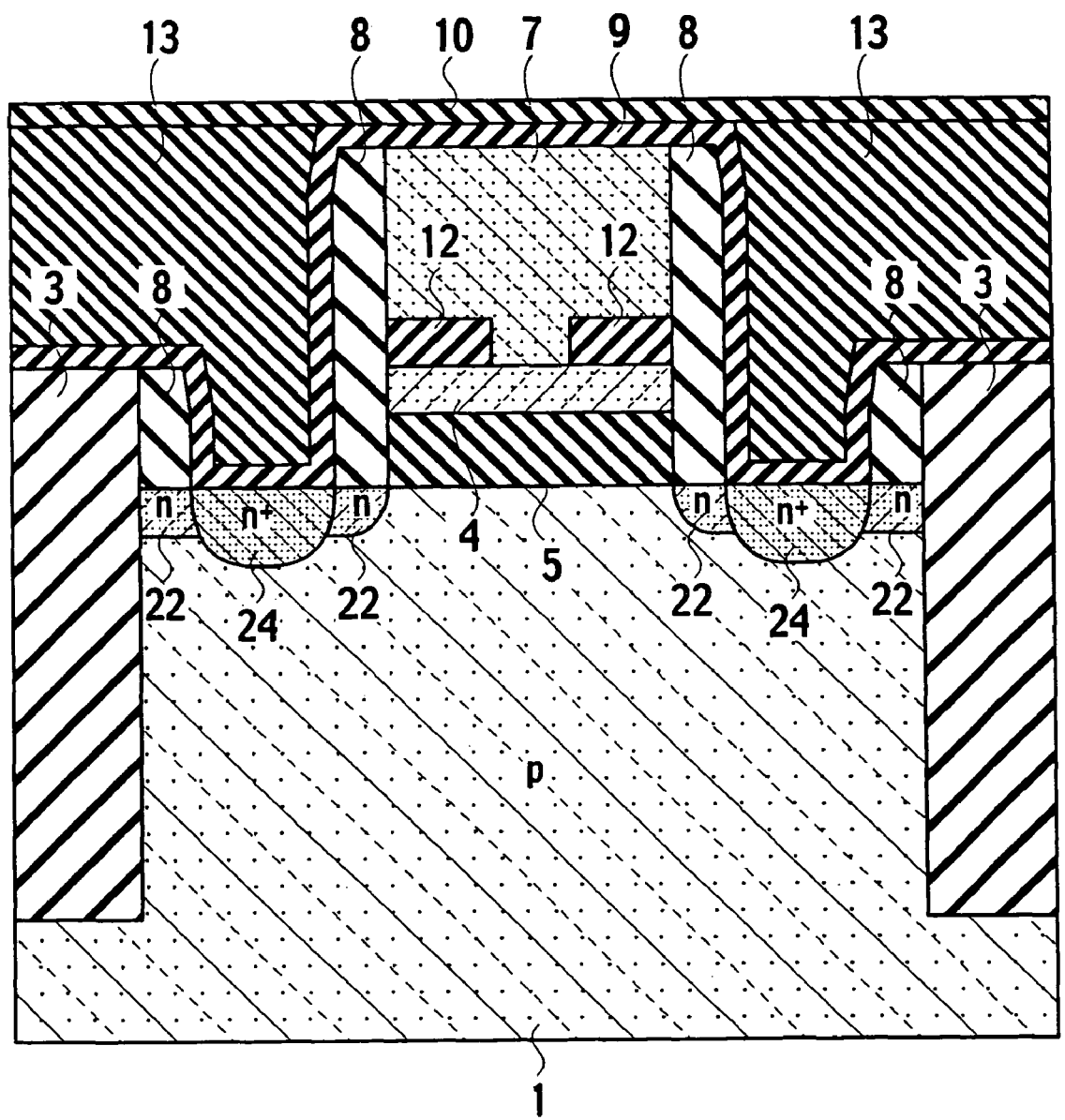
FIG. 13 schematically shows a cross-section of a high voltage transistor for describing a process of the nonvolatile semiconductor memory fabrication method according to the first embodiment of the present invention.
Figure 14:
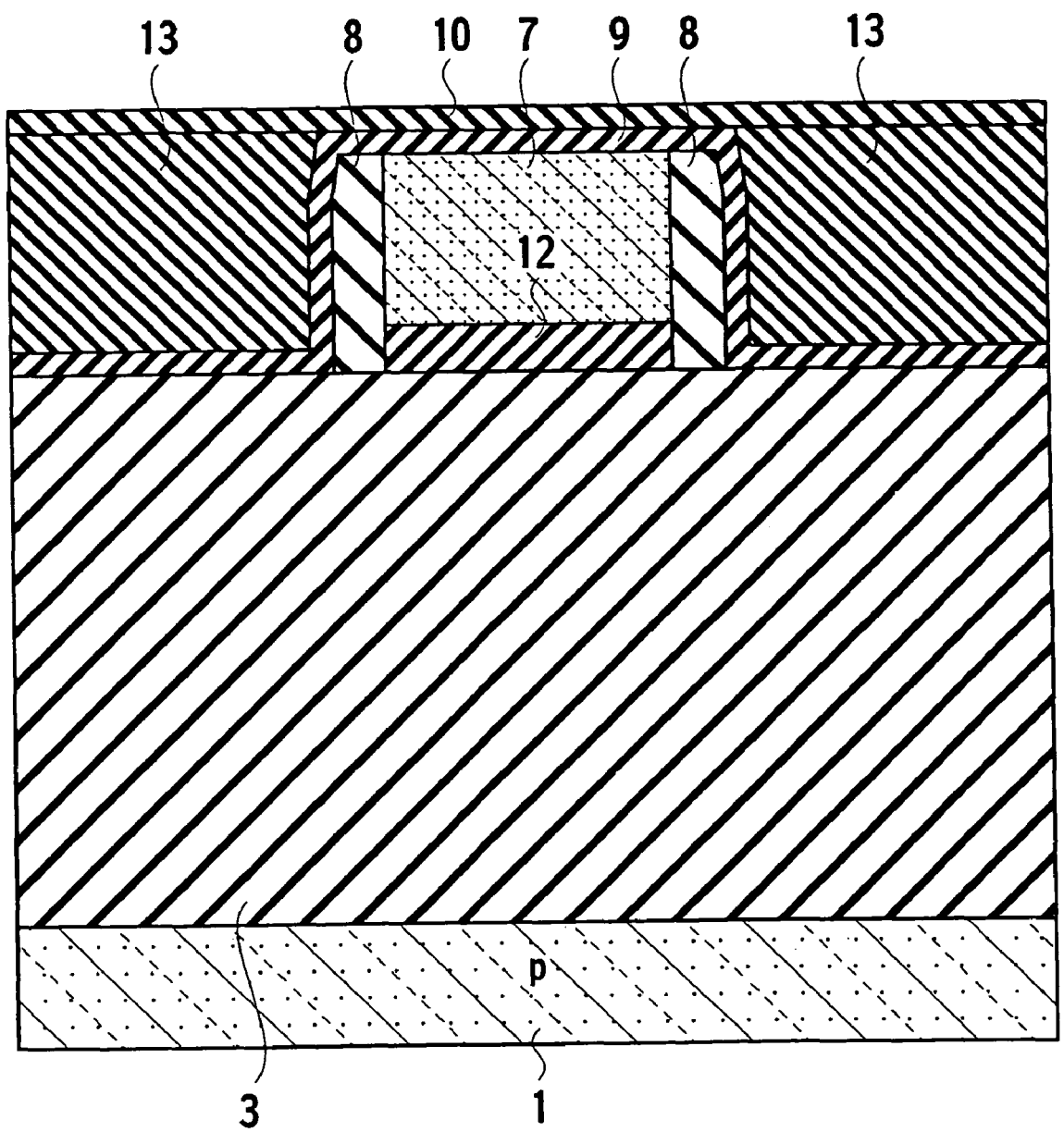
FIG. 14 schematically shows a cross-section of a resistive element for describing a process of the nonvolatile semiconductor memory fabrication method according to the first embodiment of the present invention.

(C) Interlayer Insulating Film 13 and Barrier Insulating Film 10 Formation Process FIGS. 11 through 14 show cross-sections of interlayer insulating films 13 and a barrier insulating film 10, formed after the sidewall insulating films 8 and the liner insulating films 9, shown in FIGS. 7 through 10, have been formed. More specifically, FIG. 11 schematically shows a cross-section of a memory cell transistor; FIG. 12 shows a cross-section of a low voltage transistor; FIG. 13 schematically shows a cross-section of a high voltage transistor; and FIG. 14 schematically shows a cross-section of a resistive element.

(n) Following the processes shown in FIGS. 7 through 10, the interlayer insulating film 13 is deposited across the entirety of the memory cell transistor, the low voltage transistor, the high voltage transistor, and the resistive element.

(o) The entirety of the memory cell transistor, the low voltage transistor, the high voltage transistor, and the resistive element is planarized until reaching the liner insulating film 9, using planarization technology such as chemical mechanical polishing (CMP).

(p) The barrier insulating film 10, which serves as a metallic salicide stopper film, is then deposited across the entirety of the planarized memory cell transistor, the low voltage transistor, the high voltage transistor, and the resistive element, providing the respective structures shown in FIGS. 11 through 14.

(D) Metallic Salicide Film 11 Formation Process

FIGS. 15 through 29 show results of processing a metallic salicide film 11 formed across the entirety of the memory cell transistor, the low voltage transistor, the high voltage transistor, the resistive element, and the interconnect region, after the interlayer insulating film 13 and the barrier insulating film 10, shown in FIGS. 11 through 14, have been formed. More specifically, FIG. 15 schematically shows a planar pattern structure of a memory cell array region; FIG. 16 schematically shows a cross-section of a memory cell transistor; FIG. 17 schematically shows a planar pattern of a low voltage transistor; FIG. 18 schematically shows a cross-section cut along the line I-I of FIG. 17; FIG. 19 schematically shows a cross-section cut along the line II-II of FIG. 17; FIG. 20 schematically shows a planar pattern of a low voltage transistor; FIG. 21 schematically shows a cross-section cut along the line I-I of FIG. 20; FIG. 22 schematically shows a planar pattern of a high voltage transistor; FIG. 23 schematically shows a cross-section cut along the line I-I of FIG. 22; FIG. 24 schematically shows a cross-section cut along the line III-III of FIG. 22; FIG. 25 schematically shows a cross-section of a high voltage transistor in which a metallic salicide contact region 14 is formed across the entire top surface of the control gate electrode 7 as with FIG. 20, cut along the line III-III of FIG. 22; FIG. 26 schematically shows a planar pattern of a resistive element; FIG. 27 schematically shows a cross-section cut along the line I-I of FIG. 26; FIG. 28 schematically shows a planar pattern of an interconnect region; and FIG. 29 schematically shows a cross-section cut along the line II-II of FIG. 28.

(q) Following the processes shown in FIGS. 11 through 14, the metallic salicide film 11 is formed on the control gate electrode 7 by lithography and etching. The region for forming the metallic salicide film 11 is the entire top surface of the gate electrode of the memory cell transistor as shown in FIGS. 15 and 16, on the metallic salicide contact region 14 formed on the control gate electrode 7 of the low voltage transistor as shown in FIGS. 17 through 21, on the metallic salicide contact region 14 formed on the control gate electrode 7 of the high voltage transistor as shown in FIGS. 22 through 25, on the metallic salicide contact region 14 formed on the control gate electrode 7 providing a resistive element as shown in FIGS. 26 and 27, and on the metallic salicide contact region 14 formed on the entire top surface of the control gate electrode 7 providing an interconnect region as shown in FIGS. 28 and 29.

The metallic salicide contact region 14 on the control gate electrode 7 of the low voltage transistor may be formed either on a part of the control gate electrode 7 as shown in FIGS. 17 through 19, or the entire surface thereof as shown in FIGS. 20 and 21. Similarly, the metallic salicide contact region 14 on the control gate electrode 7 of the high voltage transistor may be formed either on a part of the control gate electrode 7 as shown in FIGS. 22 through 24, or the entire surface thereof as shown in FIG. 25.

(r) Typical contact formation process and interconnect formation process are carried out.

Since the gate contact CG is always formed on the metallic salicide film 11, an appropriate selectivity for forming contacts may be provided.

(NAND Type)

Figure 30:
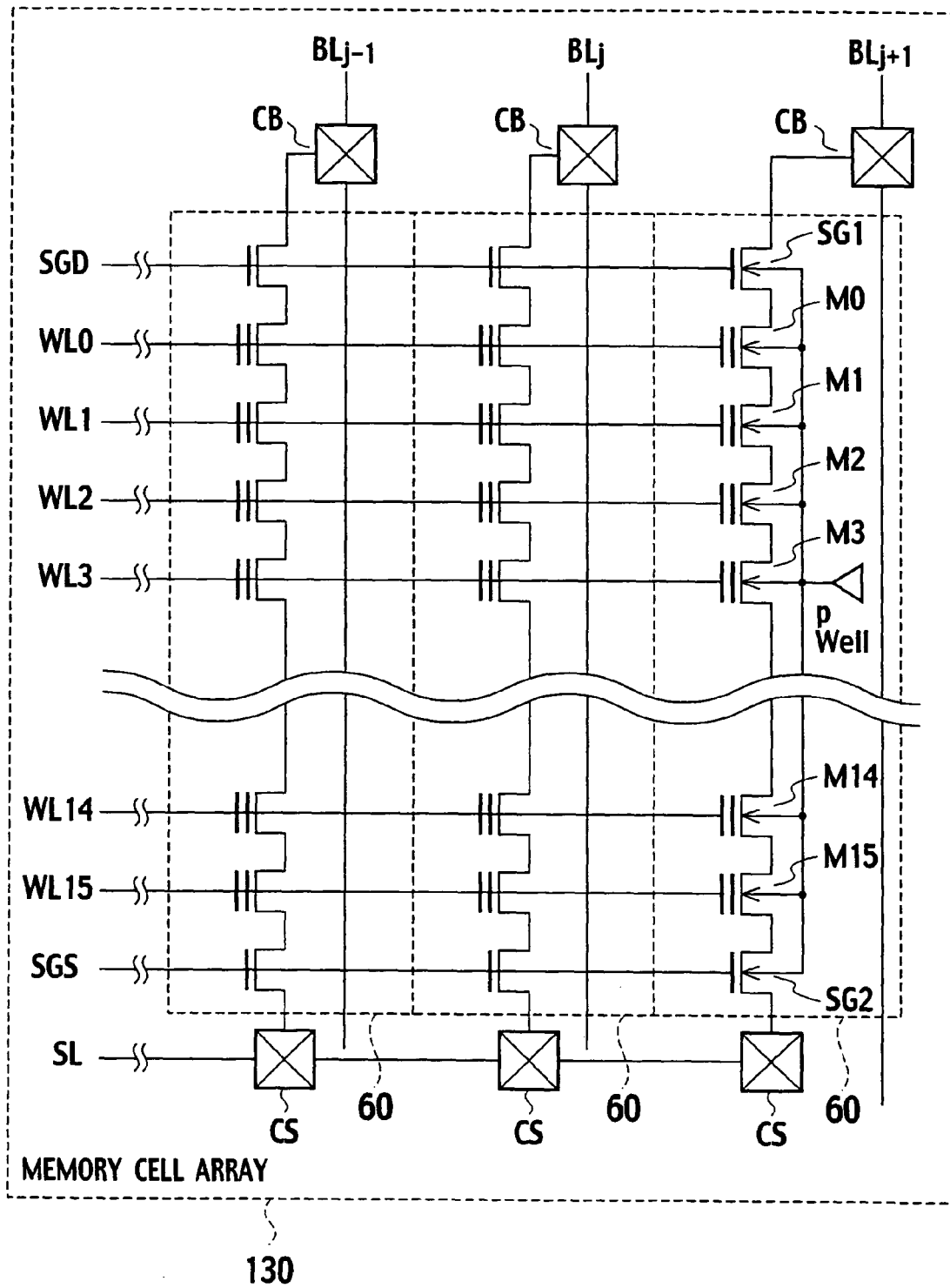
FIG. 30 schematically shows an exemplary circuit structure of a NAND memory cell array region of the nonvolatile semiconductor memory according to the first embodiment of the present invention.

As shown in FIG. 30, a schematic circuit structure of a memory cell array 130, according to the first embodiment of the present invention, provides a circuit structure of a NAND nonvolatile semiconductor memory.

NAND cell units 60 comprise memory cell transistors M0 through M15 and select gate transistors SG1 and SG2, as shown in detail in FIG. 30. The drains of the select gate transistors SG1 are connected to bit lines . . . , $BL_{j-1}$, $BL_j$, $BL_{j+1}$, . . . via respective bit line contacts CB. The sources of the select gate transistors SG2 are connected to the common source line SL via respective source line contacts CS.

In respective NAND cell units 60, word lines WL0 through WL 15 are connected to the control gates of the memory cell transistors M0 through M15, and select gate lines SGD and SGS are connected to the gates of the select gate transistors SG1 and SG2, respectively.

The NAND nonvolatile semiconductor memory shown in FIG. 30 comprises a memory cell transistor with a stacked gate structure, shown in FIG. 16, as a basic structure. Multiple memory cell transistors M0 through M15 are connected in series along the bit line length via source and drain diffusion layers 20 of respective memory cell transistors, comprising a single NAND string.

As a result, the described structure comprises each of the NAND memory cell units 60, arranged in parallel along the word line WL length orthogonal to the bit lines BL.

According to the nonvolatile semiconductor memory of the first embodiment of the present invention, formation of a metallic salicide film only directly beneath gate contacts of respective elements and word lines in the NAND flash memory simultaneously increases operating speed, improves integration, and permits easy fabrication of the memory cell transistor, increases operating speed and easy fabrication of the low voltage transistor, increase in breakdown voltage and operating speed and permits easy fabrication of the high voltage transistor, and increases operating speed and permits easy fabrication of the resistive element and interconnect region.

Figure 31:
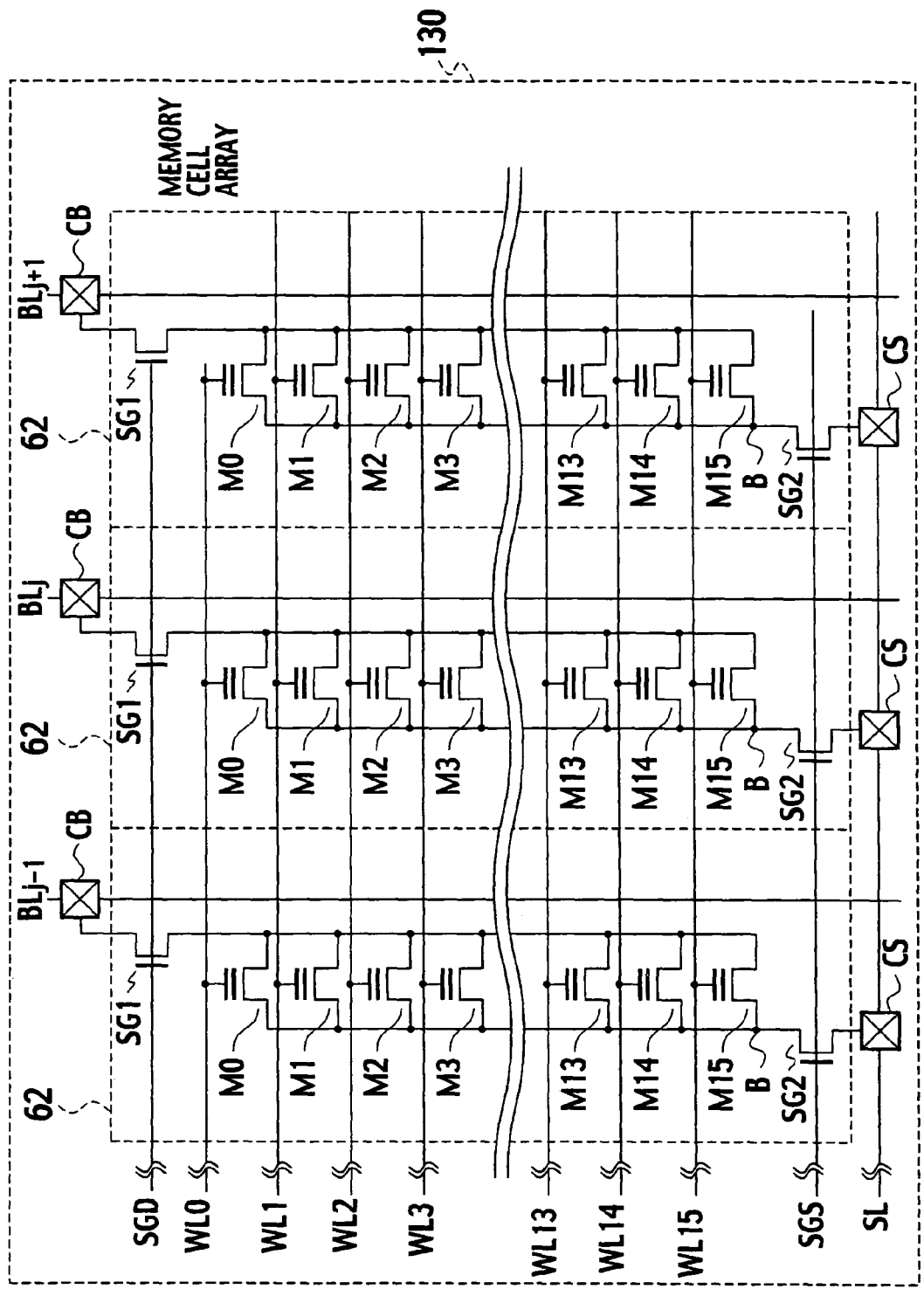
FIG. 31 schematically shows an exemplary circuit structure of an AND memory cell array region of nonvolatile semiconductor memory according to a second embodiment of the present invention.

Second Embodiment (AND Type) As shown in FIG. 31, a schematic circuit structure of a memory cell array 130, according to the second embodiment of the present invention, is an AND nonvolatile semiconductor memory.

The AND nonvolatile semiconductor memory, shown in FIG. 31, comprises a basic structure of a memory cell transistor with a stacked gate structure.

The AND cell units 62 comprise memory cell transistors M0 through M15 connected in parallel and select gate transistors SG1 and SG2, as shown in detail in FIG. 31. The drains of the select gate transistors SG1 are connected to the bit lines . . . , $BL_{j-1}$, $BL_j$, $BL_{j+1}$, . . . via respective bit line contacts CB. The sources of the select gate transistors SG2 are connected to the common source line SL via respective source line contacts CS.

An AND cell unit is indicated at 62, within the dotted line of FIG. 31. In each AND cell unit 62, the drain regions of the memory cell transistors M0 through M15 are commonly connected and the source regions thereof are also commonly connected. Word lines WL1 through WL15 are connected to the respective gates of the memory cell transistors M0 through M15. A select gate line SGD is connected to the gates of respective select gate transistors SG1, and a select gate line SGS is connected to the gates of respective select gate transistors SG2.

According to the nonvolatile semiconductor memory of the second embodiment of the present invention, formation of a metallic salicide film only directly beneath gate contacts of respective elements and word lines in the AND flash memory simultaneously increases operating speed, improves integration, and permits easy fabrication of a memory cell transistor, increases operating speed and permits easy fabrication of a low voltage transistor, increases breakdown voltage and operating speed and permits easy fabrication of a high voltage transistor, and increases operating speed and permits easy fabrication of a resistive element and an interconnect region.

Figure 32:
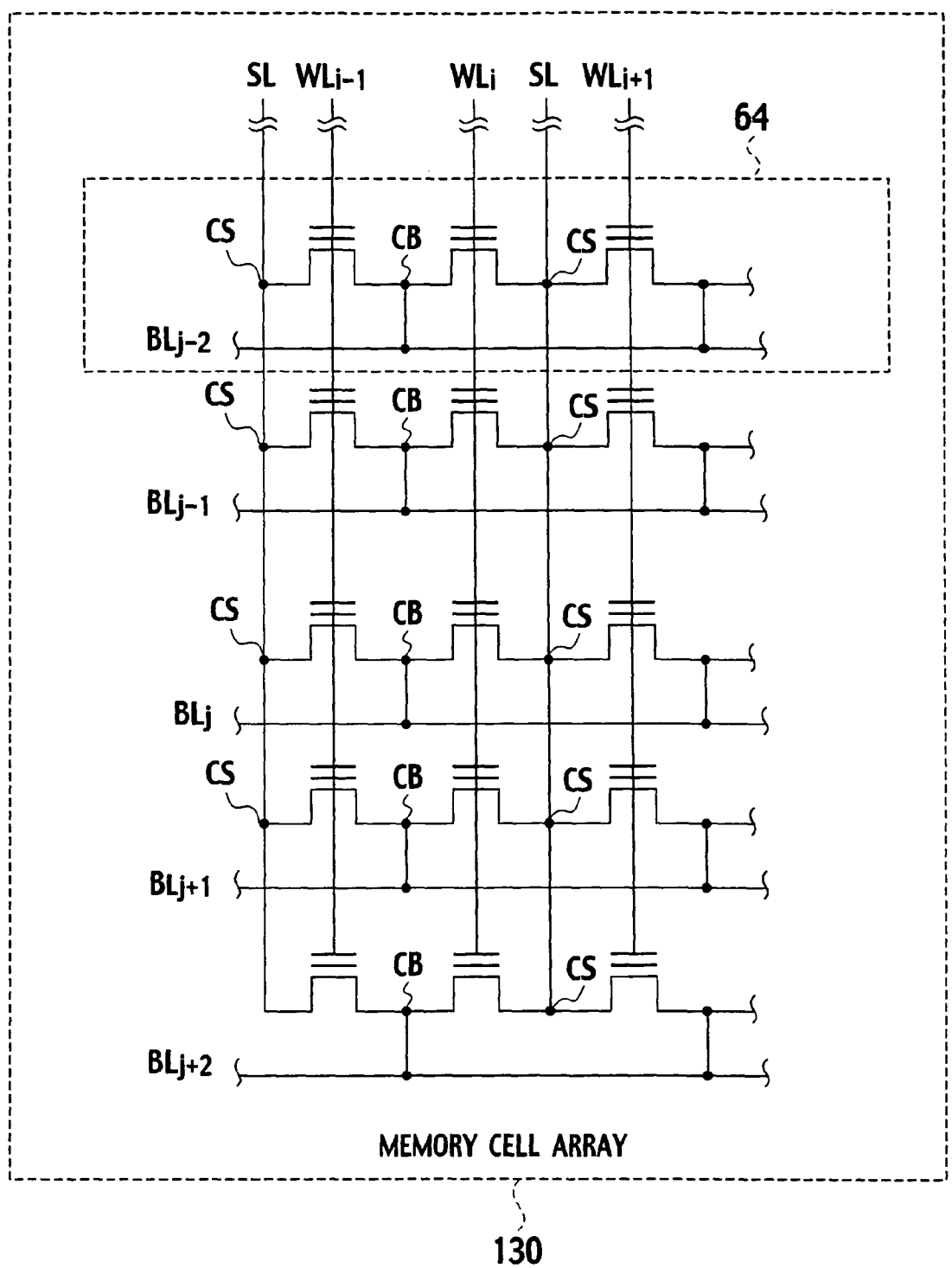
FIG. 32 schematically shows an exemplary circuit structure of a NOR memory cell array region of nonvolatile semiconductor memory according to a third embodiment of the present invention.

Third Embodiment (NOR Structure)
As shown in FIG. 32, a schematic circuit structure of a memory cell array 130, according to the third embodiment of the present invention, provides a circuit of the NOR nonvolatile semiconductor memory.

The NOR nonvolatile semiconductor memory shown in FIG. 32 comprises a memory cell transistor with a stacked gate structure.

A NOR cell unit is shown at 64 and is enclosed by a dotted line in FIG. 32. In each NOR cell unit 64, the common source region of two adjacent memory cell transistors is connected to a source line SL via a source line contact CS, and the common drain region is connected to bit lines $BL_{j-2}$, $BL_{j-1}$, $BL_j$, $BL_{j+1}$, $BL_{j+2}$ via a bit line contact CB. The NOR cell unit 64 is arranged along the length of word lines $WL_{i-1}$, $WL_i$, $WL_{i+1}$, . . . orthogonal to the bit lines $BL_{j-2}$, $BL_{j-1}$, $BL_j$, $BL_{j+1}$, $BL_{j+2}$, . . . , and memory cell transistor gates are commonly connected to the respective word lines $WL_{i-1}$, $WL_i$, $WL_{i+1}$, . . . . The nonvolatile semiconductor memory with the NOR circuit structure allows faster reading than the NAND structure.

According to the nonvolatile semiconductor memory of the third embodiment, formation of a metallic salicide film only directly beneath gate contacts of respective elements and word lines in a NOR flash memory simultaneously increases operating speed, improves in integration, and permits easy fabrication of a memory cell transistor, increases operating speed and permits easy fabrication of a low voltage transistor, increases breakdown voltage and operating speed and permits easy fabrication of a high voltage transistor, and increases operating speed and permits easy fabrication of a resistive element and an interconnect region.

Figure 33:
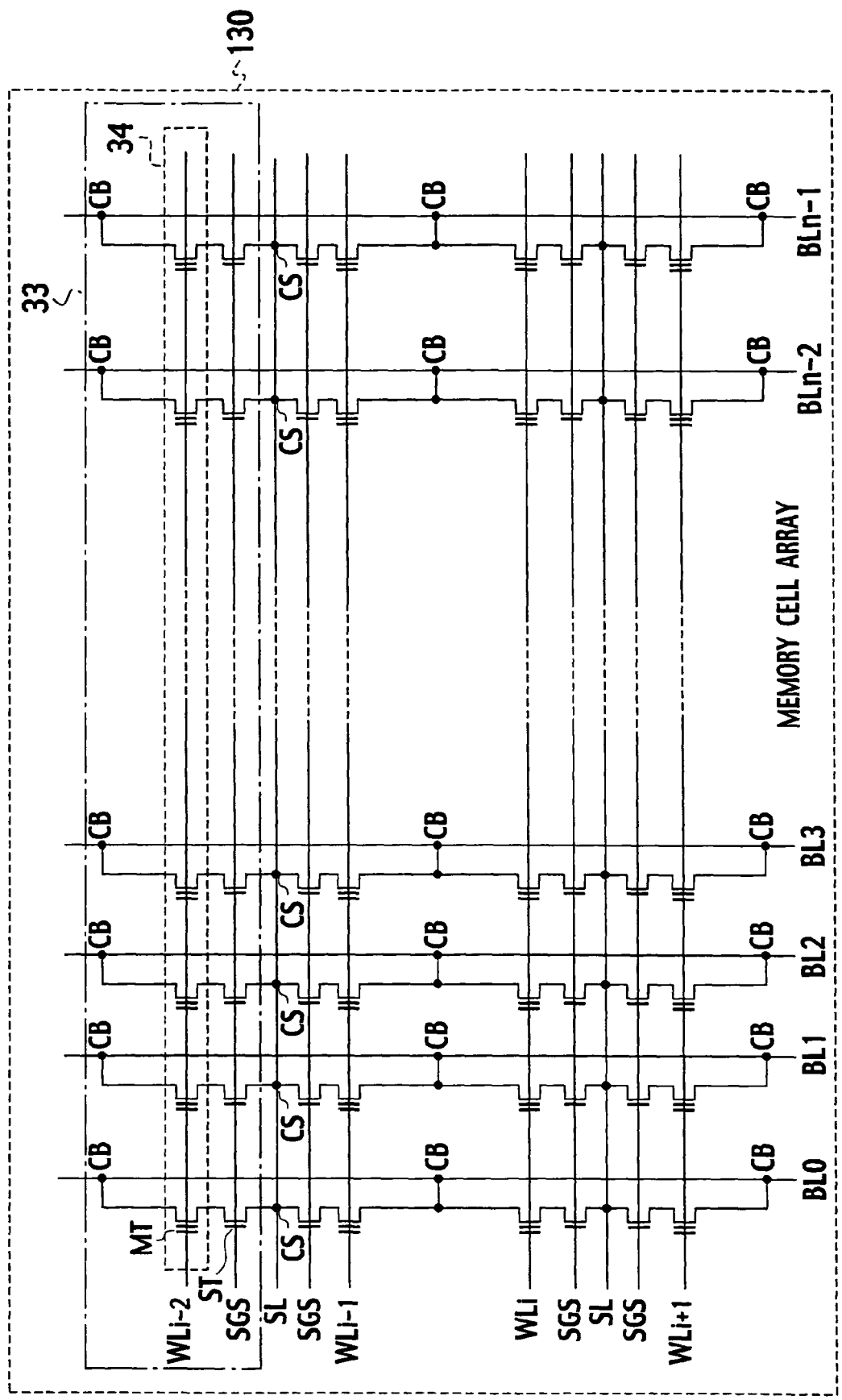
FIG. 33 schematically shows an exemplary circuit structure of a two-transistor/cell type memory cell array region of nonvolatile semiconductor memory according to a fourth embodiment of the present invention.

Fourth Embodiment (Two-transistor/cell Type)
As shown in FIG. 33, a schematic circuit structure of a memory cell array 130, according to the fourth embodiment of the present invention, provides a circuit of the two-transistor/cell type nonvolatile semiconductor memory.

The exemplary semiconductor memory according to the fourth embodiment has a basic two-transistor/cell system structure and, as shown in FIG. 33, comprises a memory cell transistor MT and a select transistor ST.

The memory cell transistor. MT comprises a stacked gate structure including a gate insulating film 2 formed as a tunnel insulating film on a p-well or semiconductor substrate 1, a floating gate 4, an inter-gate insulating film 12, and a control gate 7 arranged on the inter-gate insulating film 12. The drain region of the memory cell transistor MT is connected to a bit line contact (CB) via a diffusion layer 20, and the source region is connected to the drain region of the select transistor ST via the diffusion layer 20. The source region of the select transistor ST is connected to a source line contact (CS) via the diffusion layer 20. Such two-transistor/cell system memory cells are arranged in parallel along the length of the word line WL and, as shown in FIG. 33, comprise a memory cell block 33.

In a single memory cell block 33, the word line $WL_{i-2}$ is commonly connected to control gates 7 of respective memory cell transistors MT, comprising a page unit 34. Note that pages within multiple blocks may naturally be grouped into a page unit.

A select gate line SGS is commonly connected to the gates of the select transistors ST.

Circuitry having a two-transistor/cell system memory cells symmetrically arranged with the source line SL, as a line of symmetry, is serially arranged along the length of bit lines BL0, BL1, BL2, ..., BLn-1.

According to the nonvolatile semiconductor memory of the fourth embodiment, formation of a metallic salicide film only directly beneath gate contacts of respective elements and word lines in a two-transistor/cell type flash memory simultaneously increases operating speed, improves integration, and permits easy fabrication of a memory cell transistor, increases operating speed and permits easy fabrication of a low voltage transistor, increases breakdown voltage and operating speed and permits easy fabrication of a high voltage transistor, and increases operating speed and permits easy fabrication of a resistive element and an interconnect region.

Fifth Embodiment (Three-transistor/cell Type)

Figure 34:
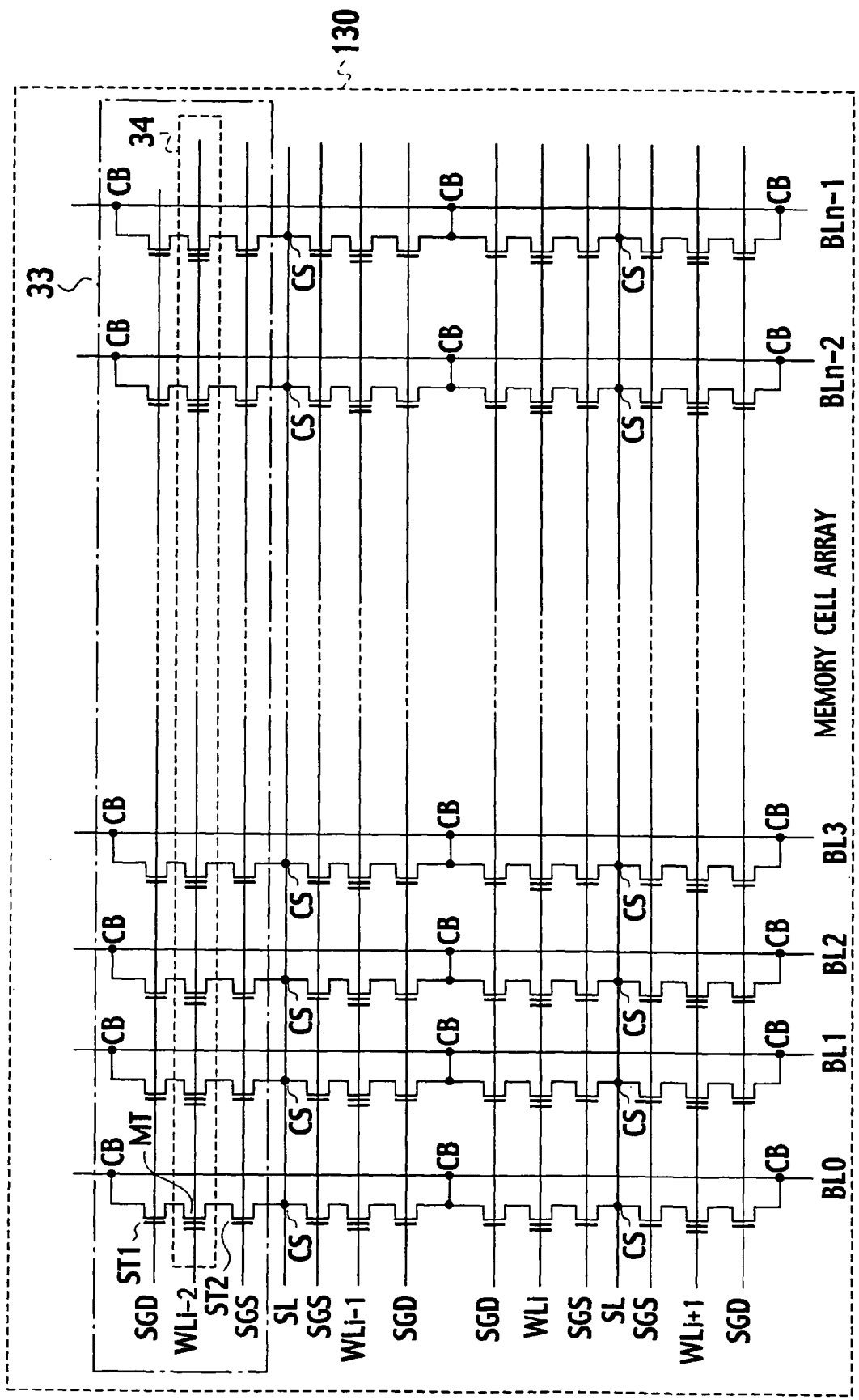
FIG. 34 schematically shows an exemplary circuit structure of a three-transistor/cell type memory cell array region of nonvolatile semiconductor memory according to a fifth embodiment of the present invention.

As shown in FIG. 34, a schematic circuit structure of a memory cell array 130, according to the fifth embodiment of the present invention, provides a circuit structure of the three-transistor/cell type nonvolatile semiconductor memory.

The exemplary semiconductor memory according to the fifth embodiment has a basic three-transistor/cell system structure, and, as shown in FIG. 34, comprises a memory cell transistor MT and select transistors ST1 and ST2.

The memory cell transistor MT comprises a stacked gate structure including a gate insulating film 2 formed as a tunnel insulating film on a p-well or semiconductor substrate 1, a floating gate 4, an inter-gate insulating film 12, and a control gate 7 arranged on the inter-gate insulating film 12. The select transistors ST1 and ST2 are disposed on either side of the memory cell transistor MT, respectively. The drain region of the memory cell transistor MT is connected to a bit line contact (CB) via a bit line side select transistor ST1, and the source region is connected to a source line contact (CS) via a source line side select transistor ST2. Such three-transistor/cell system memory cells are arranged in parallel along the length of the word line WL, and, as shown in FIG. 34, configure a memory cell block 33. In a single memory cell block 33, the word line $WL_{i-2}$ is commonly connected to control gates 7 of respective memory cells, configuring a page unit 34. Note that pages within multiple blocks may naturally be grouped into a page unit.

A select gate line SGS is commonly connected to the gates of the source line side select transistors ST2, and a select gate line SGD is commonly connected to the gates of the bit line side select transistors ST1. Circuitry having three-transistor/cell system memory cells symmetrically arranged with the source line SL as a line of symmetry is arranged in series along the length of bit lines BL0, BL1, BL2, ..., BLn-1.

According to nonvolatile semiconductor memory of the fifth embodiment, medium operation between a NAND type and a NOR type semiconductor memory can be achieved.

According to the nonvolatile semiconductor memory of the fifth embodiment, formation of a metallic salicide film only directly beneath gate contacts of respective elements and word lines in the three-transistor/cell type flash memory simultaneously increases operating speed, improves integration, and permits easy fabrication of a memory cell transistor, increases operating speed and permits easy fabrication of a low voltage transistor, increases breakdown voltage and operating speed and permits easy fabrication of a high voltage transistor, and increases in operating speed and permits easy fabrication of a resistive element and an interconnect region.

APPLICATION EXAMPLE

Figure 35:
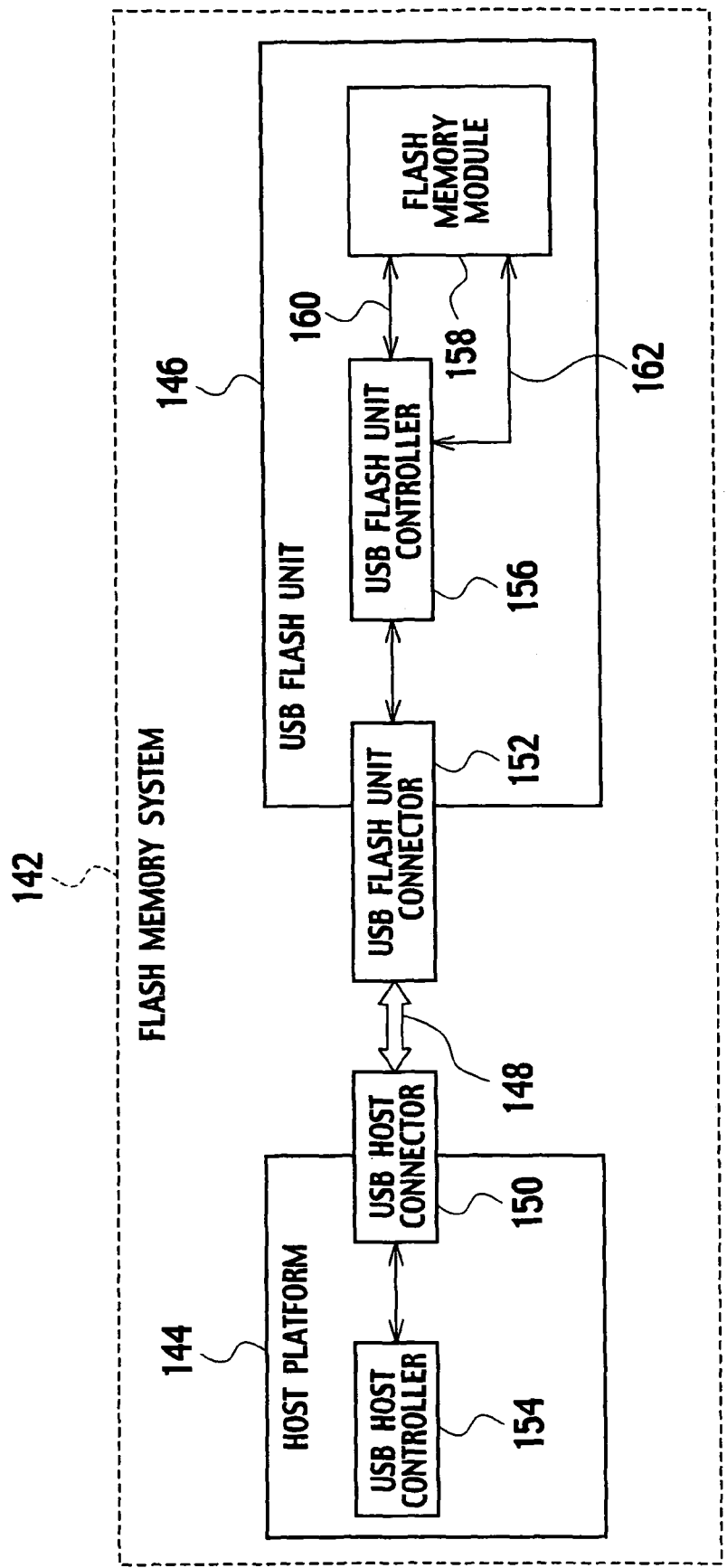
FIG. 35 is a schematic block diagram of major components of a flash memory device or system according to an application example of the nonvolatile semiconductor memory of the first through the fifth embodiment of the present invention.

FIG. 35 shows an application example of the semiconductor memory according to the first through the fifth embodiment of the present invention. FIG. 35 is a schematic diagram of principal elements of a flash memory device and system implemented by the semiconductor memory, particularly the nonvolatile semiconductor memory according to the embodiments of the present invention. As shown in the drawing, a flash memory system 142 comprises a host platform 144 and a universal serial bus (USB) flash unit 146.

The host platform 144 is connected to the USB flash unit 146 embedded with the nonvolatile semiconductor memory, according to the embodiments of the present invention, via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 comprises a USB flash unit controller 156, which controls other elements in the USB flash unit 146 and also controls the interface to the USB bus of the USB flash unit 146; the USB flash unit connector 152; and at least one flash memory module 158 comprising the nonvolatile semiconductor memory according to the first through the fifth embodiment of the present invention.

When the USB flash unit 146 is connected to the host platform 144, standard USB enumeration processing begins. In this processing, the host platform 144 recognizes the USB flash unit 146, selects the mode for transmission therewith, and performs reception/transmission of data from/to the USB flash unit 146 via a FIFO buffer, referred to as an end point, that stores transfer data. The host platform 144 recognizes changes in the physical and electrical states, such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet through the USB cable 148. If the USB flash unit 146 is a unit including the end point that has received the request packet, the request is accepted by the USB flash unit controller 156.

Next, the USB flash unit controller 156 performs various operations such as read-in, write-in or erasure of data from or to the flash memory module 158. In addition, the USB flash unit controller 156 supports basic USB functions such as acquiring a USB address and the like. The USB flash unit controller 156 controls the flash memory module 158 via either a control line 160 used to control output from the flash memory module 158, or, for example, other various signals such as a chip enable signal CE, a read-out signal or a write-in signal. The flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the result and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148.

Other Embodiments

While the present invention has been described according to the first through the fifth embodiment, these embodiments and drawings constituting a part of this disclosure do not limit the scope of the present invention. This disclosure shows those skilled in the present invention a variety of embodiments, alternative embodiments, and operational technologies.

A stacked gate structure is disclosed as a standard element structure of a memory cell transistor of the nonvolatile semiconductor memory according to the first through the fifth embodiment, but is not limited to such stacked structure. Needless to say, a sidewall control gate structure or a MONOS structure is an alternative structure. In addition, needless to say, various modified examples and alternatives of the fabrication process are available.

Moreover, the memory cell transistor of the nonvolatile semiconductor memory according to the first through the fifth embodiment is not limited to a two-valued logic memory. For example, the present invention is applicable to multi-valued logic memory, such as three or more valued logic memory. For example, four-valued nonvolatile semiconductor memory may provide a memory capacity twice that of the two-valued nonvolatile semiconductor memory. In addition, the present invention is applicable to multi (m)-valued nonvolatile semiconductor memory (where m is greater than 3).

Furthermore, a structure of the nonvolatile semiconductor memory according to the first through the fifth embodiment where a metallic salicide film is formed on the respective gate electrodes of the memory cell transistor, the high voltage transistor, and the low voltage transistor has been described. The structure may be synthesized by forming a metallic salicide film in he respective source and drain regions of the memory cell transistor, the high voltage transistor, and the low voltage transistor.

As such, the present invention naturally includes various embodiments not described herein. Accordingly, the technical scope of the present invention should be defined by only the claims that appear appropriate from the aforementioned description.

Needless to say, the present invention includes a variety of embodiments or the like not disclosed herein. Therefore, the technical scope of the present invention should be defined by only inventive descriptions according to the claimed invention, which is appropriate according to the aforementioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation. Various modifications will become possible for those skilled in the art after receiving the teachings of the present disclosure without departing from the scope thereof.

What is claimed is:

1. A nonvolatile semiconductor memory comprising:
   a cell array region configured to include a memory cell transistor that comprises first source and drain regions, a gate insulating film on a semiconductor region between the first source and drain regions, a first floating gate electrode on the gate insulating film, and a first control gate electrode stacked on the first floating gate electrode via a first inter-gate insulating film;
   a low voltage circuit region configured to include a low voltage transistor that comprises a first element isolating region, second source and drain regions, which contact with the first element isolating region, a low voltage gate insulating film on a semiconductor region between the second source and drain regions, a second floating gate electrode on the low voltage gate insulating film, a second inter-gate insulating film, provided with an opening, on the second floating gate electrode, a second control gate electrode on the second inter-gate insulating film, a first metallic salicide film on the second control gate electrode, and a first gate contact electrically in contact with the metallic salicide film; and
   a high voltage circuit region configured to include a high voltage transistor that comprises a second element isolating region, third source and drain regions, which contact with the second element isolating region, a high voltage gate insulating film on a semiconductor region between the third source and drain regions, a third floating gate electrode on the high voltage gate insulating film, a third inter-gate insulating film, provided with an opening, on the third floating gate electrode, a third control gate electrode on the third inter-gate insulating film, a second metallic salicide film on the third control gate electrode, and a second gate contact electrically in contact with the second metallic salicide film,
   wherein the first metallic salicide film is formed only directly beneath the gate contact, and the second metallic salicide film is formed only directly beneath the second gate contact.

2. The nonvolatile semiconductor memory of claim 1, further comprising:
   a circuit region configured to include a transistor that comprises a first element isolating region, second source and drain regions, which contact with the element isolating region, a gate insulating film on a semiconductor region between the second source and drain regions, a second floating gate electrode on the gate insulating film, a second inter-gate insulating film, provided with an opening, on the second floating gate electrode, a second control gate electrode on the second inter-gate insulating film, a metallic salicide film on the second control gate electrode, and a gate contact electrically in contact with the first metallic salicide film;
   wherein the metallic salicide film is formed directly beneath the gate contact and formed on the element isolation region.

3. The nonvolatile semiconductor memory of claim 2, wherein the memory cell transistor further comprises a third metallic salicide film electrically in contact with the first control gate electrode.

4. The nonvolatile semiconductor memory of claim 3, further comprising:
an interconnect region configured to include a third element isolating region, which isolates the low voltage circuit region, and the high voltage circuit region from the cell array region, a fourth control gate electrode on the third element isolating region, and a fourth metallic salicide film electrically in contact with the fourth control gate electrode.

5. The nonvolatile semiconductor memory of claim 4, wherein the first through the fourth metallic salicide films are a silicide material selected from the group consisting of cobalt (Co), nickel (Ni), titanium (Ti), tantalum (Ta) platinum (Pt), molybdenum (Mo), tungsten (W), or palladium (Pd).

6. The nonvolatile semiconductor memory of claim 2, wherein the cell array has a NAND memory cell array circuit structure.

7. The nonvolatile semiconductor memory of claim 2, wherein the cell array has an AND memory cell array circuit structure.

8. The nonvolatile semiconductor memory of claim 2, wherein the cell array has a NOR memory cell array circuit structure.

9. The nonvolatile semiconductor memory of claim 2, wherein the cell array has a two-transistor/cell type memory cell array circuit structure.

10. The nonvolatile semiconductor memory of claim 2, wherein the cell array has a three-transistor/cell type memory cell array circuit structure.

11. A nonvolatile semiconductor memory comprising:
a cell array region configured to include first source and drain regions, a gate insulating film on a semiconductor region between the first source and drain regions, a first floating gate electrode on the gate insulating film, and a first control gate electrode stacked on the first floating gate electrode via a first inter-gate insulating film;
a low voltage circuit region configured to include a low voltage transistor that comprises a first element isolating region, second source and drain regions, which contact with the first element isolating region, a low voltage gate insulating film on a semiconductor region between the second source and drain regions, a second floating gate electrode on the low voltage gate insulating film, a second inter-gate insulating film, provided with an opening, on the second floating gate electrode, a second control gate electrode on the second inter-gate insulating film, a first metallic salicide film on the second control gate electrode, and a first gate contact electrically in contact with the first metallic salicide film;
a high voltage circuit region configured to include a high voltage transistor that comprises a second element isolating region, third source and drain regions, which contact with the second element isolating region, a high voltage gate insulating film on a semiconductor region between the third source and drain regions, a third floating gate electrode on the high voltage gate insulating film, a third inter-gate insulating film, provided with an opening, on the third floating gate electrode, a third control gate electrode on the third inter-gate insulating film, a second metallic salicide film on the third control gate electrode, and a second gate contact electrically in contact with the second metallic salicide film; and
a resistive element configured to include a third element isolating region configured to isolate the low voltage circuit region, and the high voltage circuit region from the cell array region, a fourth control gate electrode on the third element isolating region, a resistive contact electrically in contact with the fourth control gate electrode, and a third metallic salicide film electrically in contact with the resistive contact,
wherein the first metallic salicide film is formed directly beneath the first gate contact and formed only on the element isolation region; the second metallic salicide film is formed directly beneath the second gate contact and formed only on the element isolation region; and the third metallic salicide film is formed directly beneath the resistive contact and formed only on the element isolation.

12. The nonvolatile semiconductor memory of claim 11, wherein the memory cell transistor further comprises a fourth metallic salicide film electrically in contact with the first control gate electrode.

13. The nonvolatile semiconductor memory of claim 11, wherein the first gate contact is formed directly over the first element isolating region; the second gate contact is formed directly over the second element isolating region; and the resistive contact is formed directly over the third element isolating region.

14. The nonvolatile semiconductor memory of claim 11, further comprising:
a fourth element isolating region configured to isolate the low voltage circuit region, and the high voltage circuit region from the cell array region, and an interconnect region configured to comprise a fifth control gate electrode on the fourth element isolating region and a fifth metallic salicide film electrically in contact with the fifth control gate electrode.

15. The nonvolatile semiconductor memory of claim 14, wherein the first through the fifth metallic salicide film are a silicide material selected from the group consisting of cobalt (Co), nickel (Ni), titanium (Ti), tantalum (Ta) platinum (Pt), molybdenum (Mo), tungsten (W), or palladium (Pd).

16. The nonvolatile semiconductor memory of claim 11, wherein the cell array has a NAND memory cell array circuit structure.

17. The nonvolatile semiconductor memory of claim 11, wherein the cell array has an AND memory cell array circuit structure.

18. The nonvolatile semiconductor memory of claim 11, wherein the cell array has a NOR memory cell array circuit structure.

19. The nonvolatile semiconductor memory of claim 11, wherein the cell array has a two-transistor/cell type memory cell array circuit structure.

20. The nonvolatile semiconductor memory of claim 11, wherein the cell array has a three-transistor/cell type memory cell array circuit structure.

* * * * *